(12) United States Patent
Nishiura et al.

(10) Patent No.: US 12,007,410 B2
(45) Date of Patent: Jun. 11, 2024

(54) SHEET CONNECTOR, SHEET SET, ELECTRICAL INSPECTION DEVICE, AND ELECTRICAL INSPECTION METHOD

(71) Applicant: Mitsui Chemicals, Inc., Tokyo (JP)

(72) Inventors: Katsunori Nishiura, Chiba (JP); Taichi Koyama, Yokohama (JP); Daisuke Yamada, Yokohama (JP)

(73) Assignee: Mitsui Chemicals, Inc., Tokyo (JP)

( * ) Notice: Subject to any disclaimer, the term of this patent is extended or adjusted under 35 U.S.C. 154(b) by 0 days.

(21) Appl. No.: 17/778,048

(22) PCT Filed: Nov. 19, 2020

(86) PCT No.: PCT/JP2020/043266
§ 371 (c)(1),
(2) Date: May 19, 2022

(87) PCT Pub. No.: WO2021/100825
PCT Pub. Date: May 27, 2021

(65) Prior Publication Data
US 2022/0413009 A1 Dec. 29, 2022

(30) Foreign Application Priority Data
Nov. 22, 2019 (JP) ................................ 2019-211817

(51) Int. Cl.
*G01R 1/067* (2006.01)
*G01R 1/04* (2006.01)
*H01R 13/24* (2006.01)

(52) U.S. Cl.
CPC ....... *G01R 1/0416* (2013.01); *G01R 1/06761* (2013.01); *H01R 13/2414* (2013.01)

(58) Field of Classification Search
CPC ............ H01R 13/2414; H01R 2201/20; H01R 12/714; H01R 13/03; H01R 43/007;
(Continued)

(56) References Cited

U.S. PATENT DOCUMENTS 6,002,177 A * 12/1999 Gaynes ............... H01L 25/0657
257/746
7,598,609 B2 * 10/2009 Uang ..................... B82Y 10/00
257/E21.627
(Continued)

FOREIGN PATENT DOCUMENTS

| CN | 107706173 A | * | 2/2018 |
| JP | 07-282878 A | | 10/1995 |

(Continued)

OTHER PUBLICATIONS

International Search Report of PCT/JP2020/043266 dated Feb. 2, 2021.

*Primary Examiner* — Vinh P Nguyen
(74) *Attorney, Agent, or Firm* — Shih IP Law Group, PLLC.

(57) ABSTRACT

A sheet connector according to the present invention has: a first insulating layer having a first surface positioned on one side in the thickness direction, a second surface positioned on the other side, and a plurality of first through-holes passing through between the first surface and the second surface; and a plurality of first conductive layers arranged on the inner wall surfaces of the first through-holes. First ends of the first conductive layers on the first surface side project from the first surface.

20 Claims, 14 Drawing Sheets

(58) Field of Classification Search
CPC .. H01R 12/523; H01R 13/46; H01R 13/2407; H01R 13/516; H01R 13/5224; H01R 12/716; H01R 13/24; H01R 33/76; H01R 13/631; H01R 39/643; H01R 12/52; H01R 13/62; H01R 4/04; G01R 3/00; G01R 31/2863; G01R 1/0735; G01R 1/0416; G01R 1/0408; G01R 1/07314; G01R 1/07307; G01R 31/2889; G01R 1/06711; G01R 1/073; G01R 1/06; G01R 1/045; G01R 1/07378; G01R 1/06761; G01R 1/07371; G01R 1/06772; G01R 31/275; G01R 31/2808; G01R 31/2887; G01R 31/2884; G01R 31/26; G01R 31/2601; G01R 31/311; H01L 2924/15311; H01L 2924/14; H01L 23/49827; H01L 2924/3025; H01L 21/76898; H01L 2224/73265; H01L 2924/0002; H01L 24/16; H01L 25/0657; H01L 24/19; H01L 21/4857; H01L 24/45; H01L 24/24; H01L 23/5383; H01L 27/14636; H01L 24/14
See application file for complete search history.

(56) References Cited

U.S. PATENT DOCUMENTS

| | | | | |
|---|---|---|---|---|
| 8,755,196 | B2* | 6/2014 | Ouchi | H01L 23/49816 |
| | | | | 361/767 |
| 10,916,521 | B2* | 2/2021 | Hotta | H01L 24/72 |
| 2002/0111055 | A1 | 8/2002 | Matsumura | |
| 2006/0160383 | A1 | 7/2006 | Yamada | |
| 2014/0066545 | A1* | 3/2014 | Moon | C08G 59/621 |
| | | | | 523/454 |
| 2017/0330828 | A1 | 11/2017 | Kurooka | |
| 2021/0104854 | A1 | 4/2021 | Tsuchiya | |
| 2022/0413013 | A1 | 12/2022 | Nishiura | |

FOREIGN PATENT DOCUMENTS

| | | | |
|---|---|---|---|
| JP | 10-041627 | A | 2/1998 |
| JP | H11340637 | * | 11/1999 |
| JP | 2000-331538 | A | 11/2000 |
| JP | 2003-208820 | A | 7/2003 |
| JP | 2005-056791 | A | 3/2005 |
| JP | 2006-284418 | A | 10/2006 |
| JP | 2007-073388 | A | 3/2007 |
| JP | 2007-220512 | A | 8/2007 |
| JP | 2010-062155 | A | 3/2010 |
| JP | 2010-153263 | A | 7/2010 |
| JP | 2013008591 | A | 1/2013 |
| JP | 7273989 | B2 | 5/2023 |
| WO | 2016/098865 | A1 | 6/2016 |
| WO | WO 2016006660 | * | 6/2016 |
| WO | 2018/212277 | A1 | 11/2018 |

* cited by examiner

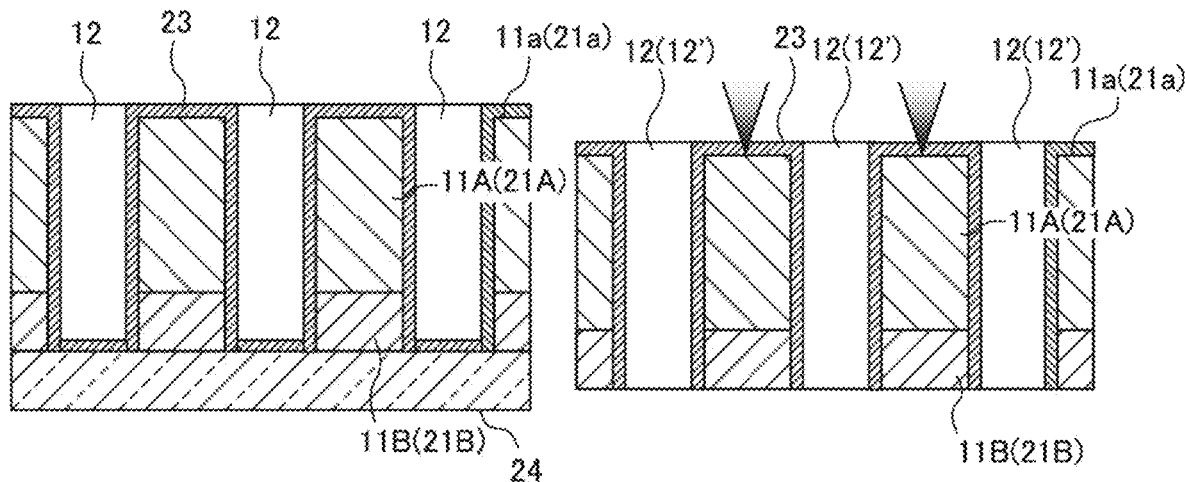
FIG. 9E
FIG. 9F
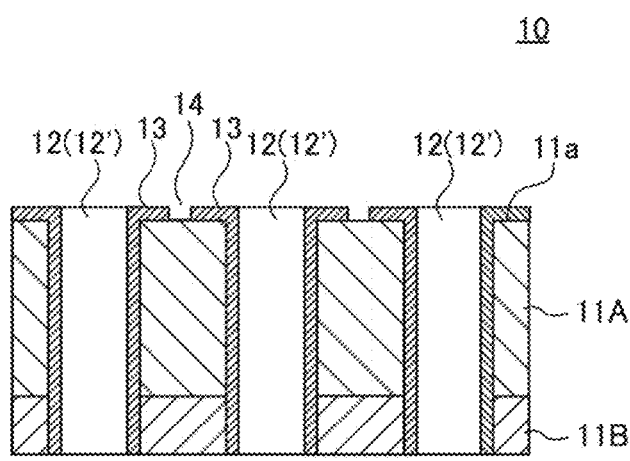
FIG. 9G

SHEET CONNECTOR, SHEET SET, ELECTRICAL INSPECTION DEVICE, AND ELECTRICAL INSPECTION METHOD

TECHNICAL FIELD

The present invention relates to a sheet connector, a sheet set, an electrical testing apparatus and an electrical testing method.

BACKGROUND ART

Semiconductor devices such as printed circuit boards mounted in electronic products are usually subjected to electrical testing. Usually, electrical testing is performed by electrically contacting a substrate (with an electrode) of an electrical testing apparatus and a terminal of an inspection object such as a semiconductor device, and reading the current obtained when a predetermined voltage is applied between the terminals of the inspection object. Then, for the purpose of reliably performing the electrical contact between the electrode of the substrate of the electrical testing apparatus and the terminal of the inspection object, an anisotropic conductive sheet is disposed between the substrate of the electrical testing apparatus and the inspection object.

The anisotropic conductive sheet is a sheet with conductivity in the thickness direction and insulation properties in the surface direction, and is used as a probe (contact) in electrical testing. For the purpose of reliably performing electrical contact between an electrode of a substrate of an electrical testing apparatus and a terminal of an inspection object, the anisotropic conductive sheet is disposed and pressed between the substrate of the electrical testing apparatus and the inspection object.

As such an anisotropic conductive sheet, an anisotropic conductive sheet including a sheet with a plurality of through holes extending in the thickness direction and a plurality of conduction parts formed by plating provided at the inner wall surface of the through hole is known (see, for example, PTLS 1 and 2).

Repetition of an operation of pressurizing the inspection object on the surface of the anisotropic conductive sheet tend to cause deformation due to wear and permanent deformation due to the pressure contact of the conductive path exposed to the surface of the anisotropic conductive sheet. As a result, the electric resistance value may vary among a plurality of conductive paths, and highly accurate electrical testing may not be performed.

In view of this, electrical testing with a sheet connector disposed on the surface of the anisotropic conductive sheet has been studied. As such a sheet connector, a sheet connector including an insulating sheet and a plurality of electrode structures disposed in its thickness direction has been proposed (for example PTL 3).

CITATION LIST

Patent Literature

PTL 1
Japanese Patent Application Laid-Open No. 2007-220512
PTL 2
Japanese Patent Application Laid-Open No. 2010-153263
PTL 3
Japanese Patent Application Laid-Open No. 2010-062155

SUMMARY OF INVENTION

Technical Problem

In recent years, from the viewpoint of achieving electrical testing with higher accuracy, and achieving the use for electrical contact with various objects other than electrical testing and the like, it is desired for the sheet connector as that disclosed in PTL 3 to more reliably achieve electrical contact with objects.

To solve the above-mentioned problems, an object of the present invention is to provide a sheet connector, a sheet set, an electrical testing apparatus and an electrical testing method that can reliably perform electrical contact with an object while protecting the conductive path in the surface of the anisotropic conductive sheet.

Solution to Problem

The above-mentioned objects can be solved with the following configurations.

A sheet connector of an embodiment of the present invention includes: a first insulation layer including a first surface located on one side in a thickness direction, a second surface located on another side in the thickness direction, and a plurality of first through holes extending between the first surface and the second surface; and a plurality of first conductive layers disposed at an inner wall surface of each of the plurality of first through holes. A first end portion of each of the plurality of first conductive layers on a first surface side is protruded than the first surface.

A sheet connector of an embodiment of the present invention includes: a first insulation layer including a first surface located on one side in a thickness direction, a second surface located on another side in the thickness direction, and a plurality of first through holes extending between the first surface and the second surface; a plurality of first conductive layers disposed continuously to an inner wall surface of each of the plurality of first through holes and a periphery of an opening of each of the plurality of first through holes on the first surface in each of the plurality of first through holes; and a plurality of valley lines disposed between the plurality of first conductive layers on the first surface, and configured to insulate the plurality of first conductive layers.

A sheet set of an embodiment of the present invention includes: the sheet connector according to any one of claims 1 to 14; and an anisotropic conductive sheet configured to be disposed on the second surface of the sheet connector. The anisotropic conductive sheet includes: a second insulation layer including a third surface located on one side in a thickness direction and a fourth surface located on another side in the thickness direction; and a plurality of conductive paths disposed to extend in the thickness direction in the second insulation layer and exposed to outside of the third surface and the fourth surface, and a center-to-center distance p1 of openings of the plurality of first through holes of the sheet connector on a first surface side is smaller than a center-to-center distance p2 of the plurality of conductive paths of the anisotropic conductive sheet on a third surface side.

An electrical testing apparatus of an embodiment of the present invention includes: an inspection substrate including a plurality of electrodes; and the sheet connector or a laminate of the sheet set disposed on a surface of the inspection substrate where the plurality of electrodes is disposed. The inspection object is disposed on the first surface of the sheet connector.

An electrical testing method of an embodiment of the present invention includes: stacking an inspection substrate including a plurality of electrodes and an inspection object including a terminal through the sheet connector or a laminate of the sheet set to electrically connect each of the plurality of electrodes of the inspection substrate and the terminal of the inspection object through the sheet connector. The inspection object is disposed on the first surface of the sheet connector.

Advantageous Effects of Invention

According to the present invention, it is possible to provide a sheet connector, a sheet set, an electrical testing apparatus and an electrical testing method that can reliably perform electrical contact with an object while protecting the conductive path in the surface of the anisotropic conductive sheet.

BRIEF DESCRIPTION OF DRAWINGS

FIGS. 9E to 9G are partial sectional views illustrating a manufacturing method for the sheet connector according to Embodiment 2;

DESCRIPTION OF EMBODIMENTS

An embodiment of the present invention is elaborated below with reference to the accompanying drawings.

Embodiment 1

Figure 1A:
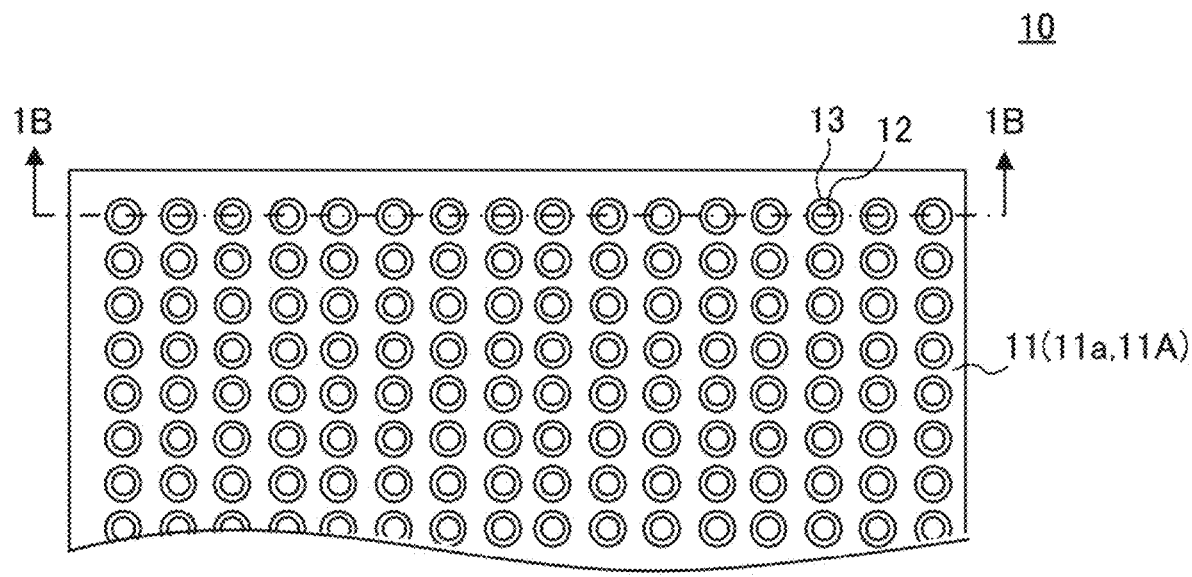
FIG. 1A is a plan view illustrating a sheet connector according to Embodiment 1.
Figure 1B:
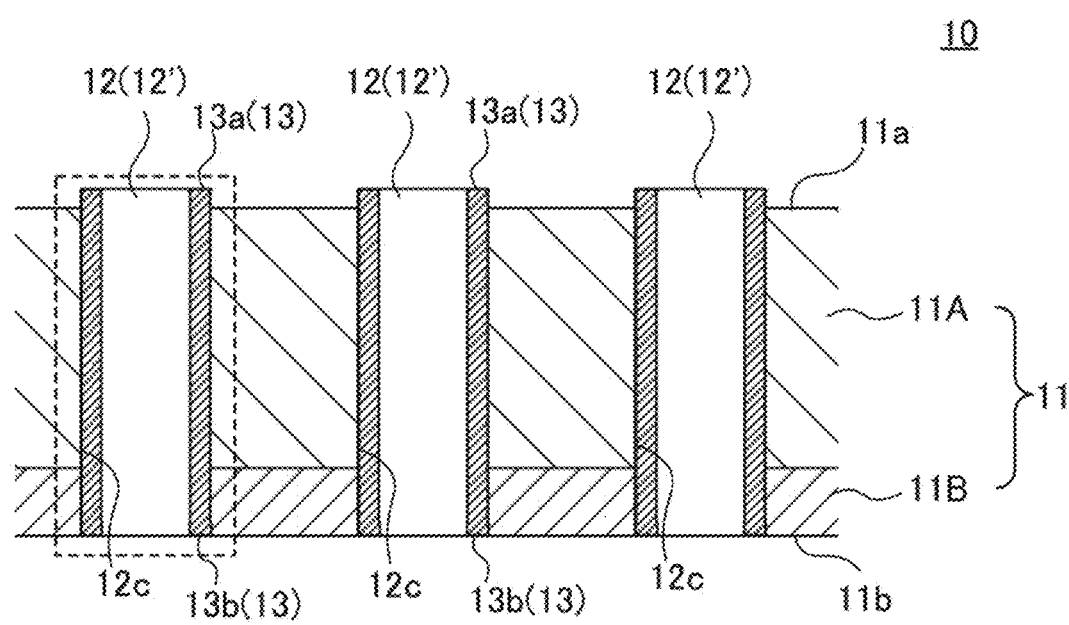
FIG. 1B is a partially enlarged sectional view taken along line 1B-1B of FIG. 1A.
Figure 2:
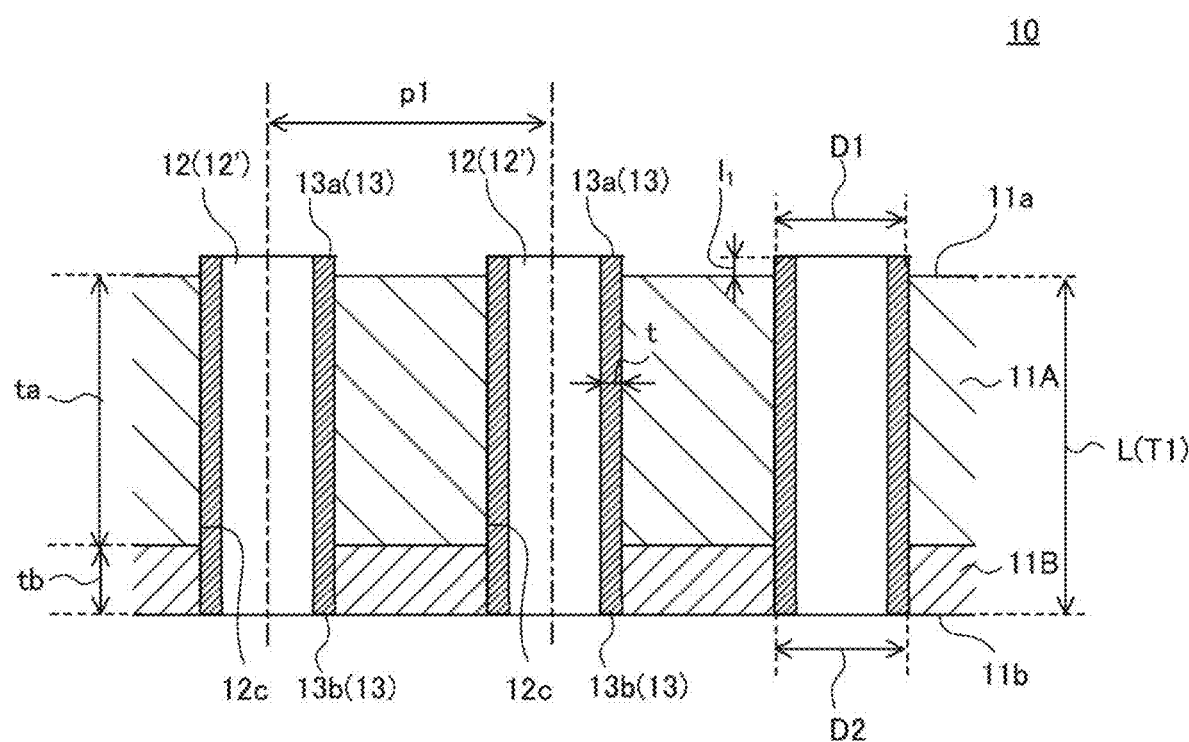
FIG. 2 is an enlarged view of FIG. 1B.

FIG. 1A is a plan view of sheet connector 10 according to Embodiment 1 (a side plan view of first surface 11a), and FIG. 1B is a partially enlarged sectional view of sheet connector 10 of FIG. 1A taken along line 1B-1B. FIG. 2 is an enlarged view of FIG. 1B.

As illustrated in FIGS. 1A and 1B, sheet connector 10 includes insulation layer 11 (first insulation layer) including a plurality of through holes 12 (first through holes), and a plurality of conductive layers 13 (first conductive layers) disposed at inner wall surfaces 12c of the plurality of through holes 12. Sheet connector 10 includes a plurality of hollows 12' surrounded by conductive layer 13.

In the present embodiment, it is preferable that the inspection object be disposed at first surface 11a of insulation layer 11.

1-1. Insulation Layer 11 (First Insulation Layer)

Insulation layer 11 includes first surface 11a located on one side in the thickness direction, second surface 11b located on the other side in the thickness direction, and the plurality of through holes 12 extending between first surface 11a and second surface 11b (see FIG. 1B).

Through hole 12 holds conductive layer 13 at its inner wall surface and increases the flexibility of insulation layer 11 so that it is easily elastically deformed (deformed) in the thickness direction of insulation layer 11.

The shape of through hole 12 is not limited, and may be a columnar shape or a prismatic shape. In the present embodiment, the shape of through hole 12 is a columnar shape. In addition, the circle equivalent diameter of through hole 12 in the cross section orthogonal to the axis direction may be constant or vary in the axial direction. The axial direction is a direction of a line connecting the center of the opening on the first surface 11a side and the center of the opening on second surface 11b side of through hole 12.

Circle equivalent diameter D1 of the opening of through hole 12 on first surface 11a side is not limited as long as center-to-center distance (pitch) p1 of the openings of the plurality of through holes 12 falls within a range describe later, and the diameter is preferably 1 to 330 μm, or more preferably 3 to 50 μm (see FIG. 2), for example. Circle equivalent diameter D1 of the opening of through hole 12 on first surface 11a side is the circle equivalent diameter of the opening of through hole 12 as viewed along the axis direction of through hole 12 from first surface 11a side.

Circle equivalent diameter D1 of the opening of through hole 12 on first surface 11a side and circle equivalent diameter D2 of the opening of through hole 12 on second surface 11b side may be identical to each other or different from each other. In the case where the circle equivalent diameter of the opening of through hole 12 is different between first surface 11a side and second surface 11b side, the ratio the diameters (circle equivalent diameter D1 of the opening on the first surface 11a side/circle equivalent diameter D2 of the opening on second surface 11b side) is, for example, 0.7 to 1.5, while the ratio is preferably 0.8 to 1.2.

Center-to-center distance p1 of the openings of the plurality of through holes 12 on first surface 11a side is not limited, and may be appropriately set in accordance with the pitch of the terminal of the inspection object. The pitch of a terminal of a high bandwidth memory (HBM) as an inspection object is 55 μm, and the pitch of a terminal of a package on package (PoP) is 400 to 650 μm, and accordingly, center-to-center distance p1 of the openings of the plurality of through holes 12 on first surface 11a side may be 5 to 650 μm, for example. In particular, from the view point of eliminating the need for the alignment of the terminal of the inspection object (from the view point of achieving alignment free), it is preferable that center-to-center distance p1 of the openings of the plurality of through holes 12 on first surface 11a side be 5 to 55 μm.

Center-to-center distance p1 of the openings of the plurality of through holes 12 on the first surface 11a side is the minimum value of the center-to-center distances of the openings of the plurality of through holes 12 on the first surface 11a side. The center of the opening of through hole 12 is the center of gravity of the opening. In addition, center-to-center distance of the openings of the plurality of through holes 12 may be constant or vary in the axial direction.

The ratio (L/D1) of axial length L of through hole 12 to circle equivalent diameter D1 of the opening of through hole 12 on first surface 11a side is not limited, while it is preferably 3 to 20 (see FIG. 2).

Insulation layer 11 includes at least base material layer 11A (first base material layer) composed of a first resin composition, and may include other layers (such as adhesive layer 11B) as necessary. That is, insulation layer 11 may be composed of a single layer, or a plurality of layers. In the present embodiment, insulation layer 11 includes base material layer 11A including first surface 11a, and adhesive layer 11B including second surface 11b (see FIG. 1B).

Base Material Layer 11A (First Base Material Layer)

Base material layer 11A is a layer including first surface 11a where inspection object is disposed, and is composed of the first resin composition.

Base material layer 11A does not have adhesion. More specifically, the probe tack value at 25° C. at first surface 11a of base material layer 11A is preferably 1N/5 mmφ or smaller. The probe tack value can be measured in compliance with ASTM D2979:2016, at 25° C.

Likewise, more specifically, the adhesive force at 25° C. to a SUS surface of base material layer 11A is preferably 1N/25 mm or smaller. The adhesive force can be measured in compliance with JIS0237:2009 as an adhesive force at a peel-off angle of 90°.

The first resin composition making up base material layer 11A is not limited as long as the probe tack value or the adhesive force satisfies the above-mentioned range and the plurality of conductive layers 13 can be insulated therebetween.

From the viewpoint of easily achieving the probe tack value or the adhesive force base material layer 11A satisfying the above-mentioned range, an appropriate hardness of insulation layer 11, and formation of fine-pitch conductive layer 13, it is preferable that the glass transition temperature or storage modulus G1 of the first resin composition making up base material layer 11A be higher than the glass transition temperature or storage modulus G3 of a third resin composition making up adhesive layer 11B.

In addition, it is preferable that the glass transition temperature or storage modulus G1 of the first resin composition (making up base material layer 11A of sheet connector 10) be higher than the glass transition temperature or storage modulus G2 of the second resin composition (making up insulation layer 41 of anisotropic conductive sheet 40).

For example, it is preferable that base material layer 11A do not excessively deform (moderately hard), and be composed of a resin composition that does not contain elastomer from the viewpoint of easily forming fine-pitch through hole 12 that achieves alignment free (first aspect). On the other hand, in the case where sheet connector 10 is used alone as an anisotropic conductive sheet, it is preferable that base material layer 11A easily deform when making pressure contact with the inspection object, and be composed of a cross-linked first elastomer composition including elastomer and crosslinking agent (second aspect).

That is, the deformability of base material layer 11A may be adjusted by the glass transition temperature and storage modulus of the first resin composition making up base material layer 11A, or the configuration of base material layer 11A (whether it is porous or not).

First Aspect

From the viewpoint of achieving base material layer 11A that does not excessively deform (achieving appropriate hardness), the glass transition temperature of the first resin composition is preferably 120° C. or higher, more preferably 150° C. or higher. The glass transition temperature of the first resin composition can be measured in compliance with JIS K 7095:2012.

In addition, preferably, the first resin composition has a coefficient of thermal expansion lower than that of the third resin composition making up adhesive layer 11B. More specifically, the coefficient of thermal expansion of the first resin composition is preferably 60 ppm/K or smaller, more preferably 50 ppm/K or smaller. The coefficient of thermal expansion can be measured in compliance with JIS K7197: 1991.

In addition, storage modulus G1 at 25° C. of the first resin composition is preferably $1.0\times10^6$ to $1.0\times10^{10}$ Pa, more preferably $1.0\times10^8$ to $1.0\times10^{10}$ Pa. Storage modulus G1 of the first resin composition can be measured in compliance with JIS K 7244-1:1998/IS06721-1:1994.

The probe tack value, the adhesive force, the storage modulus and the glass transition temperature of the first resin composition may be adjusted by the resin, the crosslinking agent or the amount of filler added.

From the viewpoint of achieving the storage modulus and the glass transition temperature of the first resin composition falling within the above-mentioned range, the first resin composition is preferably a resin composition, or a cured product thereof, that contains a resin other than elastomer and does not contain elastomer.

Examples of the resin that is not elastomer include engineering plastic such as polyamide, polycarbonate, polyarylate, polysulfone, polyether sulfone, polyphenylene sulfide, polyetheretherketone, polyimide and polyetherimide, conductive resins such as polyacetylene and polythiadyl, photosensitive resins such as photosensitive polybenzoxazole and photosensitive polyimide, acrylic resins, urethane resins, epoxy resins, and olefin resins.

The first resin composition may further contain other components such as crosslinking agent, silane coupling agent, and filler as necessary. For example, in the case where the resin other than elastomer is a curable resin, it is preferable to further include a crosslinking agent.

Second Aspect

From the viewpoint of achieving base material layer 11A that easily deforms (with a moderate softness), the glass transition temperature of the first resin composition is preferably −40° C. or lower, or more preferably −50° C. or lower. The glass transition temperature of the first resin composition can be measured by the same method as the above-mentioned method.

In addition, storage modulus G1 of the first resin composition at 25° C. is preferably $1.0 \times 10^7$ Pa or smaller, more preferably $1.0 \times 10^5$ to $1.0 \times 10^7$ Pa. The storage modulus of the first resin composition can be measured by the same method as the above-mentioned method.

The probe tack value, the adhesive force, the storage modulus and the glass transition temperature of the first resin composition may be adjusted as described above by the type of the elastomer, the degree of crosslinking (or gel fraction), the amount of the filler add and the like.

From the viewpoint of achieving the storage modulus and the glass transition temperature of the first resin composition falling within the above-mentioned range, it is preferable that the first resin composition be a cross-linked product of a composition (the first elastomer composition) containing an elastomer (base polymer) and a crosslinking agent. Note that the cross-linked product may be a partially cross-linked product (the same shall apply hereinafter).

While the elastomer is not limited as long as it has insulating properties, preferable examples of the elastomer in the elastomer composition include silicone rubber, urethane rubber (urethane polymer), acrylic rubber (acrylic polymer), ethylene-propylene-diene copolymer (EPDM), chloroprene rubber, styrene-butadiene copolymer, acrylic nitrile-butadiene copolymer, poly butadiene rubber, natural rubber, polyester thermoplastic elastomer, olefin thermoplastic elastomer, fluorine-based rubber and other elastomers. Among them, silicone rubber is especially.

The crosslinking agent is appropriately selected in accordance with the type of the elastomer. Examples of the crosslinking agent of the silicone rubber include organic peroxides such as benzoyl peroxide, bis-2,4-dichlorobenzoyl peroxide, dicumylperoxide, and di-t-butyl peroxide. Examples of the crosslinking agent for acrylic rubber (acrylic polymer) include epoxy compounds, melamine compounds, and isocyanate compounds.

The first elastomer composition may further contain other components as described above as necessary.

In particular, in the case where sheet connector 10 is disposed and used at the surface of the anisotropic conductive sheet, sheet connector 10 preferably includes through hole 12 of a fine pitch. Therefore, from the viewpoint of easily forming such a through hole, base material layer 11A is preferably not easily deformed, and is a resin composition that does not contain elastomer.

A ratio (tb/ta) of thickness to of base material layer 11A to thickness tb of adhesive layer 11B is set to, for example, 4/1 to 1/2, or preferably 3/1 to 2/3 (see FIG. 2). The shape of insulation layer 11 can be easily favorably held when thickness ta of base material layer 11A has a certain value or greater, and thickness tb of adhesive layer 11B does not become excessively thin and the adhesion of second surface 11b is less impaired when thickness ta of base material layer 11A has a certain value or smaller. The ratio of thickness (tb/ta) can be calculated from the thickness of each layer of the sheet connector in the cross section observed with various microscopes, for example.

Adhesive Layer 11B

Adhesive layer 11B is a layer including second surface 11b, and is composed of the third resin composition.

Adhesive layer 11B has adhesion. Therefore, sheet connector 10 can be easily fixed to the surface of the anisotropic conductive sheet by only disposing sheet connector 10 on the surface of the anisotropic conductive sheet in contact with the adhesive layer 11B, for example.

The probe tack value at 25° C. at second surface 11b of adhesive layer 11B is preferably higher than the probe tack value at 25° C. at first surface 11a of base material layer 11A. More specifically, the probe tack value at 25° C. of adhesive layer 11B is preferably 3N/5 mmφ or greater. When the probe tack value at 25° C. of adhesive layer 11B is 3N/5 mmφ or greater, sufficient adhesion can be achieved, and sheet connector 10 can be easily fixed by only disposing it on anisotropic conductive sheet 40 without using special fixing means (see FIG. 4 described later). The probe tack value at 25° C. of adhesive layer 11B is more preferably 5 to 50N/5 mmφ, still more preferably 7 to 50N/5 mmφ from the above-described viewpoint. The probe tack value can be measured by the same method as the above-mentioned method.

The adhesive force at 25° C. to a SUS surface of adhesive layer 11B is preferably higher than the adhesive force at 25° C. of base material layer 11A to a SUS surface. More specifically, the adhesive force at 25° C. to a SUS surface of adhesive layer 11B is preferably 0.8 to 10N/25 mm, more preferably 5 to 10N/25 mm. The adhesive force can be measured by the same method as the above-mentioned method.

From the viewpoint of easily achieving the probe tack value and the adhesive force satisfying the above-mentioned range, the storage modulus G3 at 25° C. of the third resin composition making up adhesive layer 11B is preferably lower than storage modulus G1 at 25° C. of the first resin composition making up base material layer 11A. More specifically, ratio G3/G1 of storage modulus G3 of the third resin composition to storage modulus G1 of the first resin composition is preferably 0.001 to 0.9. Storage modulus G3 of the third resin composition is not limited as long as it satisfies the above-mentioned relationship while storage modulus G3 of the third resin composition is preferably $1.0 \times 10^4$ to $1.0 \times 10^6$ Pa, for example. Storage modulus G3 of the third resin composition can be measured by the same method as the above-mentioned method.

From the viewpoint of easily achieving the probe tack value and the adhesive force satisfying the above-mentioned range, the glass transition temperature of the third resin composition making up adhesive layer 11B is preferably lower than the glass transition temperature of the first resin composition making up base material layer 11A. More specifically, the glass transition temperature of the third resin composition is preferably −40° C. or lower. The glass transition temperature of the third resin composition can be measured by the same method as the above-mentioned method.

The probe tack value, the adhesive force, the storage modulus and the glass transition temperature of the third resin composition can be adjusted by the type, the weight average molecular weight, the degree of crosslinking (or gel fraction) and the like of the elastomer described later.

As with the first resin composition, the third resin composition is preferably a cross-linked product of a composition (hereinafter also referred to as "third elastomer composition") containing an elastomer (base polymer) and a crosslinking agent from the viewpoint of easily achieving the probe tack value, the adhesive force, the storage modulus and the glass transition temperature satisfying the above-mentioned relationship.

The elastomer exemplified as the elastomer contained in the first elastomer composition may be used as the elastomer contained in the third elastomer composition. The type of the elastomer contained in the third elastomer composition may be identical to or different from the type of the elastomer contained in the first elastomer composition.

For example, in the case where base material layer 11A is composed of the cross-linked first elastomer composition, the type of the elastomer contained in the third elastomer composition is preferably the same as the type of the elastomer contained in the first elastomer composition from the viewpoint of increasing the adhesion between base material layer 11A and adhesive layer 11B. More specifically, in the case where the elastomer contained in the first elastomer composition is silicone rubber, the elastomer contained in the third elastomer composition is preferably silicone rubber.

The weight average molecular weight of the elastomer contained in the third elastomer composition is not limited, while it may be lower than the weight average molecular weight of the elastomer contained in the first elastomer composition from the viewpoint of easily achieving the probe tack value, the adhesive force, the storage modulus and the glass transition temperature satisfying the above-mentioned relationship, for example. The weight average molecular weight of the elastomer can be measured by polystyrene equivalent by gel permeation chromatography (GPC).

The crosslinking agent contained in the third elastomer composition may be appropriately selected in accordance with the type of the elastomer. The crosslinking agent contained in the third elastomer composition may be the same as that exemplified as the crosslinking agent contained in the first elastomer composition. The content of the crosslinking agent in the third elastomer composition is not limited, while it is preferably smaller than the content of the crosslinking agent in the first elastomer composition from the viewpoint of easily achieving the probe tack value, the adhesive force, the storage modulus or the glass transition temperature satisfying the above-mentioned relationship.

As described above, the third elastomer composition may further contain other components such as an adhesion-imparting agent, a silane coupling agent, a filler as necessary.

From the viewpoint of easily achieving the probe tack value, the adhesive force, the storage modulus and the glass transition temperature satisfying the above-mentioned relationship, the degree of crosslinking of the cross-linked third elastomer composition making up adhesive layer 11B is preferably lower than the degree of crosslinking of the cross-linked first elastomer composition making up base material layer 11A. That is, the gel fraction of the cross-linked third elastomer composition making up adhesive layer 11B is preferably lower than the gel fraction of the cross-linked first elastomer composition making up base material layer 11A.

The peel strength (interlayer peel strength) at 25° C. between adhesive layer 11B and base material layer 11A is preferably 5N/25 mm or greater, more preferably 7 to 30N/25 mm. The peel strength (interlayer peel strength) can be measured by 180° peel test in compliance with ISO29862:2007 (JIS Z 0237:2009), under a condition of a peel speed of 300 mm/min at 25° C.

Preferably, thickness tb of adhesive layer 11B is set such that the ratio of thickness (ta/tb) between base material layer 11A and adhesive layer 11B is within the above-mentioned range.

Common Matter

The thickness of insulation layer 11 is preferably 3 to 250 μm. In particular, in the case where sheet connector 10 is used together with anisotropic conductive sheet 40, thickness T1 of insulation layer 11 (making up sheet connector 10) is preferably smaller than thickness T2 of insulation layer 41 (making up anisotropic conductive sheet 40), and the thickness of insulation layer 11 is preferably 3 to 20 μm, for example. On the other hand, in the case where sheet connector 10 is used alone without being used together with anisotropic conductive sheet 40, the thickness of insulation layer 11 of connector 10 is preferably 50 to 250 μm.

1-2. Conductive Layer 13 (First Conductive Layer)

Conductive layer 13 is disposed at inner wall surface 12 of each of the plurality of through holes 12 (or hollows 12') (see FIG. 1B). Conductive layer 13 of the unit surrounded by the broken line functions as one conductive path (see FIG. 1B).

First conductive layer 13 includes first end portion 13a exposed to first surface 11a side, and second end portion 13b exposed to second surface 11b side. First end portion 13a of first conductive layer 13 is protruded than first surface 11a (see FIG. 1B). In this manner, electrical contact with inspection object 130 disposed at first surface 11a can be increased.

Protruding length $l_1$ of first end portion 13a of first conductive layer 13 from first surface 11a (see FIG. 2) is not limited, but is preferably a value with which no collapse occurs when inspection object 130 is placed, and is preferably 1 to 7 μm, for example.

The volume resistivity of the material of conductive layer 13 is not limited as long as sufficient conduction can be obtained, and for example, the volume resistivity is preferably $1.0 \times 10^{-4}$ Ω·m or smaller, more preferably $1.0 \times 10^{-6}$ to $1.0 \times 10^{-9}$ Ω·m. The volume resistivity of the material of conductive layer 13 can be measured by the method described in ASTM D 991.

It suffices that the volume resistivity of the material of conductive layer 13 falls within the above-mentioned range. Examples of the material of conductive layer 13 include metal materials such as copper, gold, platinum, silver, nickel, tin, iron or an alloy of one of them, and carbon materials such as carbon black.

The thickness of conductive layer 13 is not limited as long as sufficient conduction can be obtained. More specifically, the thickness of conductive layer 13 may be 0.1 to 5 μm. When the thickness of conductive layer 13 has a certain value or greater, sufficient conduction is easily achieved. When the thickness has a value smaller than a certain value, through hole 12 is unlikely to be closed, or the terminal of the inspection object is less likely to be damaged due to contact with conductive layer 13. Note that thickness t of conductive layer 13 is the thickness in the direction orthogonal to the thickness direction of insulation layer 11 (see FIG. 2).

The circle equivalent diameter of hollow 12' surrounded by conductive layer 13 on first surface 11a side is obtained by subtracting the thickness of conductive layer 13 from circle equivalent diameter D1 of the opening of through hole 12, and may be, for example, 1 to 330 μm.

2. Manufacturing Method for Sheet Connector

FIGS. 3A to 3I are sectional views illustrating a manufacturing method for sheet connector 10 according to the present embodiment.

Sheet connector 10 may be manufactured by any method. For example, sheet connector 10 is manufactured through a step 1) of preparing lamination sheet 21 including base material layer 21A and adhesive layer 21B (see FIG. 3A), a step 2) of disposing mask 22 on base material layer 11A of lamination sheet 21 and forming the plurality of through holes 12 at the portion not covered with mask 22 (see FIGS. 3B and 3C), a step 3) of removing mask 22 and covering the surface where adhesive layer 21B is exposed with protective sheet 24 (see FIG. 3D) to form conductive layer 23 at the surface of lamination sheet 21 where the plurality of through holes 12 is formed (see FIG. 3E), a step 4) of removing protective sheet 24 and removing a part of insulating sheet 21 on first surface 21a side (see FIG. 3F) to form the plurality of conductive layers 13 (see FIG. 3G), and a step 5) of further removing a part of lamination sheet 21 on first surface 21a side (see FIG. 3H) to protrude first end portion 13a of conductive layer 13 on first surface 11a side (see FIG. 3I).

Step 1

Figure 3A:
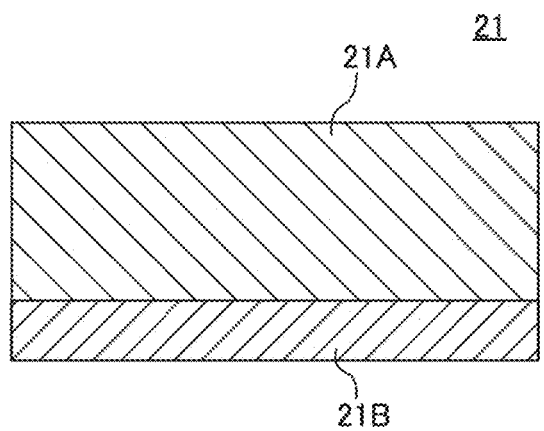
FIGS. 3A to 3F are partial sectional views illustrating a manufacturing method for the sheet connector according to Embodiment 1.
Figure 3B:
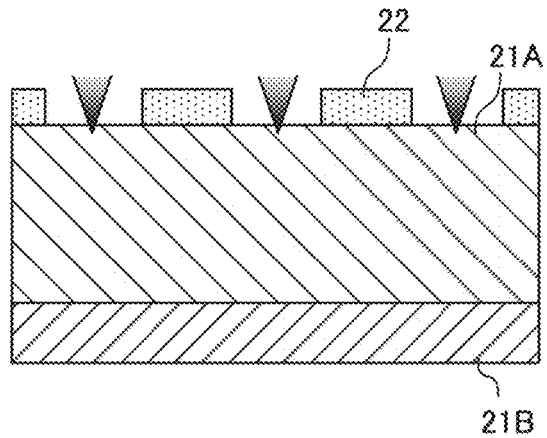
Figure 3C:
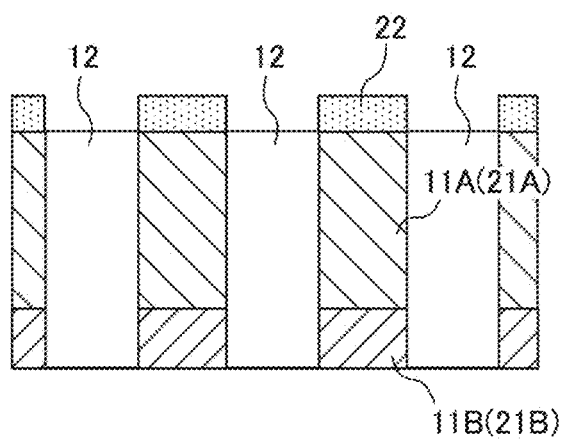

First, as insulating sheet 21, lamination sheet 21 including base material layer 21A and adhesive layer 21B is prepared (see FIG. 3A).

This insulating sheet 21 may be formed by applying or casting the third resin composition making up adhesive layer 21B on base material sheet (base material layer 21A), or by performing thermo-compression bonding of the base material sheet and the adhesive sheet.

Step 2

Next, through hole 12 is formed in the surface of lamination sheet 21. In the present embodiment, mask 22 is disposed in a pattern, and the plurality of through holes 12 is formed at the portion not covered with mask 22 (the portion for forming through hole 12) (see FIGS. 3B and 3C).

Through hole 12 may be formed by any method. For example, it may be formed by a method of mechanically forming a hole (such as pressing and punching), a laser processing method, plasma etching method and the like. In particular, from the viewpoint of easily forming through hole 12 even in insulating sheet 21 with a large area, it is preferable to use a plasma etching method to form through hole 12 (see FIG. 3B).

Plasma etching can be performed by using a radio frequency plasma etching apparatus or a micro wave plasma etching apparatus, for example.

Step 3

Figure 3D:
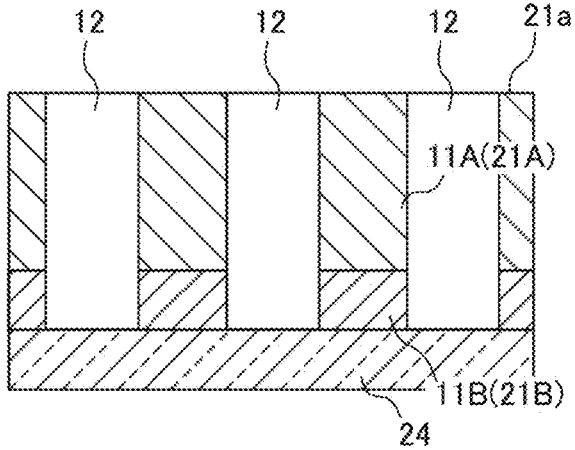

Next, mask 22 is removed from the surface of lamination sheet 21 where the plurality of through holes 12 is formed and the surface where adhesive layer 21B is exposed is covered with protective sheet 24 (see FIG. 3D).

Protective sheet 24 is not limited as long as it can protect adhesive layer 21B, and may be a glass plate, a resin film, an adhesive film or the like. The resin film may be a releasing film. Such a releasing film may be used as a protective sheet of adhesive layer 11B of sheet connector 10 (before it is used).

Figure 3E:
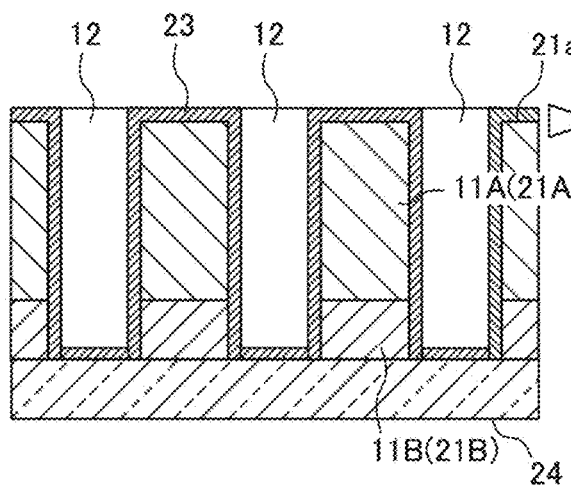
Figure 3F:
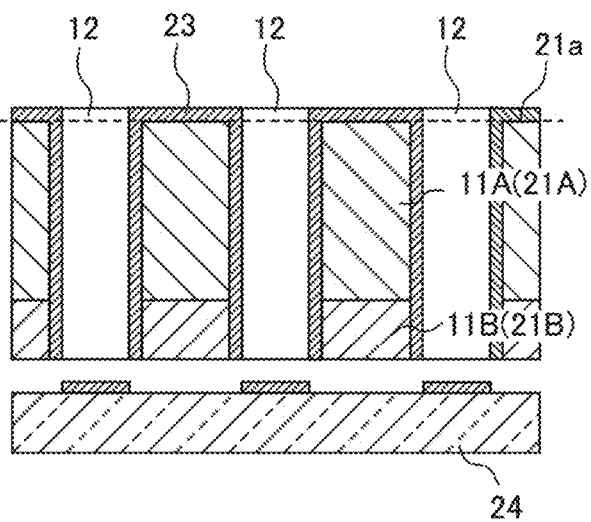

Then, one continuous conductive layer 23 is formed at the entire surface of lamination sheet 21 where the plurality of through holes 12 is formed (see FIG. 3E). More specifically, conductive layer 23 is formed continuously to inner wall surface 12c of the plurality of through holes 12 and first surface 21a at the periphery of the opening, in lamination sheet 21.

While conductive layer 23 may be formed by any methods, it is preferable to use a plating method (for example, an electroless plating method and electrolytic plating method) from the view point of forming conductive layer 23 with a small and uniform thickness without closing through hole 12.

Step 4

Figure 3G:
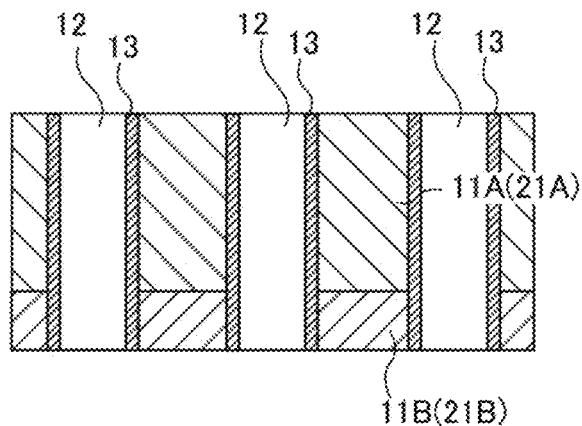
FIGS. 3G to 3I are partial sectional views illustrating a manufacturing method for the sheet connector according to Embodiment 1.

Next, a part of insulating sheet 21 on first surface 21a side is removed (see FIG. 3F) to form the plurality of conductive layers 13 (see FIG. 3G). A part of first surface 21a side may be physically removed by cutting or the like, or chemically removed by chemical etching or the like, for example.

Step 5

Figure 3H:
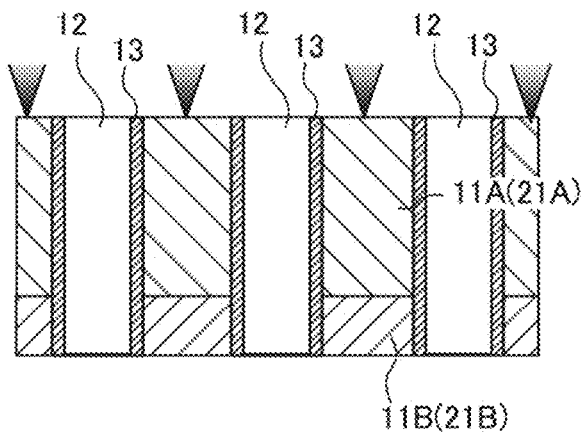
Figure 3I:
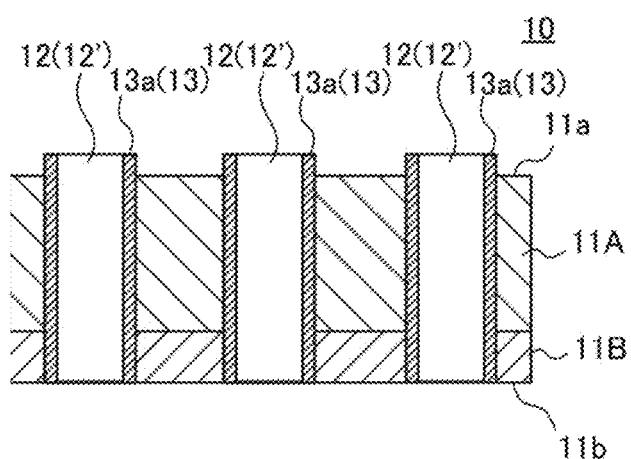

Then, a part of the obtained insulating sheet 21 on first surface 21a side is further removed (see FIG. 3H). First insulation layer 11 is etched, and a shape with protruded first end portion 13a of conductive layer 13 is obtained (see FIG. 3H). With such a shape, when inspection object 130 (see FIG. 6) is disposed on sheet connector 10, the electric resistance value is easily reduced, and stable electrical connection is easily achieved.

The method for removing a part of insulating sheet 21 on first surface 21a side is not limited, and may be a plasma treatment, for example.

Note that the manufacturing method for sheet connector 10 may further include other steps as necessary. For example, a step 6) of performing preprocessing for facilitating the formation of conductive layer 23 may be performed between the step 2) and the step 3).

Step 6

It is preferable to perform a desmear process (preprocessing) for facilitating the formation of conductive layer 23 for lamination sheet 21 where the plurality of through holes 12 is formed.

The desmear process is a process of removing the smear generated by laser processing, and is preferably an oxygen plasma treatment. For example, in the case where the insulating sheet is composed of a cross-linked silicone elastomer composition, oxygen plasma treatment on insulating sheet 21 can not only achieve ashing/etching, but also achieve formation of a silica film through oxidation of the silicone surface. The silica film can not only facilitate infiltration of plating liquid into through hole 12, but also increase the adhesion between the inner wall surface of through hole 12 and conductive layer 23.

The oxygen plasma treatment can be performed by using a plasma asher, a radio frequency plasma etching apparatus, or a micro wave plasma etching apparatus, for example.

The obtained sheet connector 10 may be used together with an anisotropic conductive sheet used as a probe of an electrical testing, or its alternative.

Effect

Sheet connector 10 of the present embodiment includes the plurality of hollows 12' (hollows derived from through hole 12) surrounded by conductive layer 13. In this manner, when sheet connector 10 is pressed in the thickness direction, it can be favorably deformed. In addition, first end portion 13a of first surface 11a side of conductive layer 13 is protruded than first surface 11a. In this manner, it is easy to contact with inspection object 130, and the contact resistance can be reduced. As a result, during electrical testing, electrical contact can be reliably performed by bringing the inspection object into pressure contact with sheet connector 10.

In addition, when used with sheet connector 10 disposed at the surface of anisotropic conductive sheet 40, the surface of anisotropic conductive sheet 40 can be protected. In this manner, variation of resistance between a plurality of conductive paths 42 of anisotropic conductive sheet 40 can be reduced.

3. Sheet Set

Figure 4:
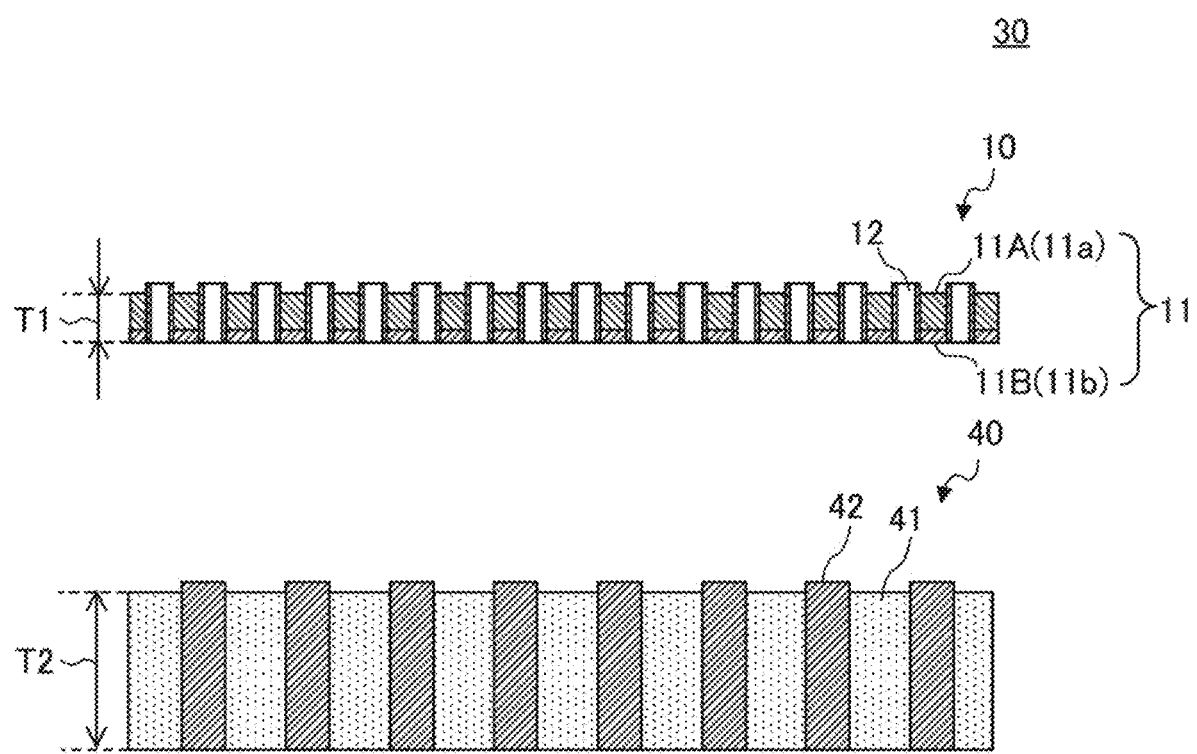
FIG. 4 is a sectional view illustrating a sheet set according to Embodiment 1.

FIG. 4 is a sectional view illustrating a manufacturing method of sheet set 30 according to the present embodiment.

As illustrated in FIG. 4, sheet set 30 according to the present embodiment includes anisotropic conductive sheet 40, and sheet connector 10 to be disposed on it. Note that sheet connector 10 is the same as sheet connector 10 according to the above-described embodiment, and therefore the description thereof will be omitted.

3-1. Anisotropic Conductive Sheet 40

Figure 5A:
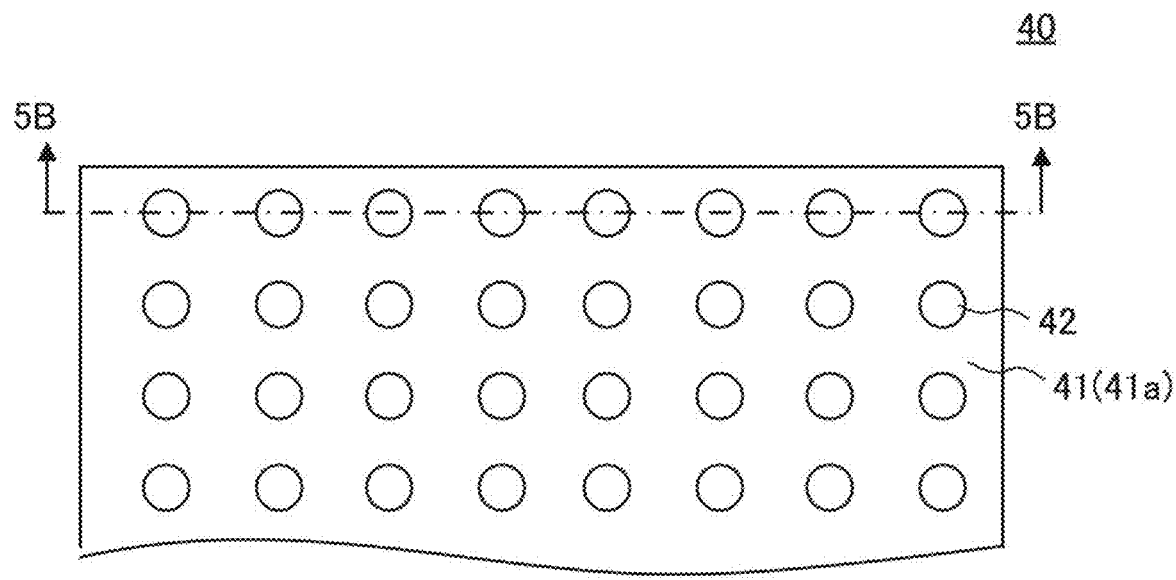
FIG. 5A is a plan view of an anisotropic conductive sheet of Embodiment 1.
Figure 5B:
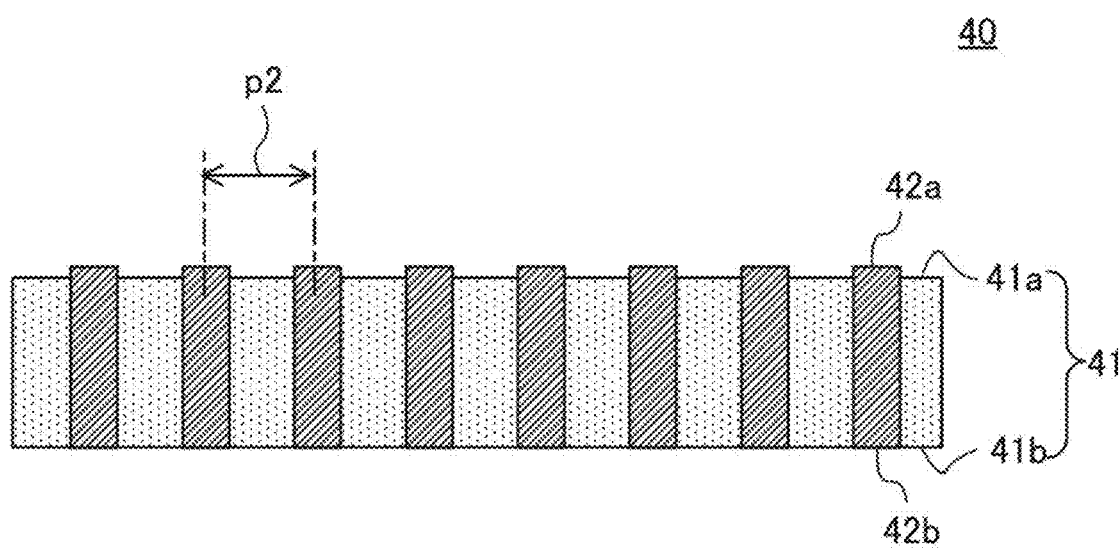
FIG. 5B is a sectional view of the anisotropic conductive sheet of FIG. 5A taken along line 5B-5B.

FIG. 5A is a plan view of anisotropic conductive sheet 40, and FIG. 5B is a partially enlarged sectional view of anisotropic conductive sheet 40 of FIG. 5A taken along line 5B-5B.

As illustrated in FIGS. 5A and 5B, anisotropic conductive sheet 40 includes insulation layer 41 (second insulation layer), and the plurality of conductive paths 42 extended in its thickness direction. In the present embodiment, preferably, it is disposed such that second surface 11b of sheet connector 10 is in contact with third surface 41a of insulation layer 41 (see FIG. 4).

3-1-1. Insulation Layer 41 (Second Insulation Layer)

Insulation layer 41 includes third surface 41a located on one side in the thickness direction, and fourth surface 41b located on the other side in the thickness direction (see FIG. 5B). The plurality of conductive paths 42 are insulated from each other.

Insulation layer 41 may include at least a base material layer (second base material layer) composed of a second resin composition, and may further include as necessary other layers (such as an adhesive layer). That is, insulation layer 41 may be composed of a single layer, or a plurality of layers. In the present embodiment, insulation layer 41 is composed of a base material layer composed of a second resin composition.

The second resin composition is not limited as long as it can insulate between the plurality of conductive paths 42, and may be identical to or different from the first resin composition making up insulation layer 11 of sheet connector 10. In particular, from the viewpoint of easily deforming insulation layer 41, it is preferable that the second resin composition making up insulation layer 41 be a cross-linked second elastomer composition. The elastomer and the cross-linking agent contained in the second elastomer composition may be the same as the elastomer and the crosslinking agent contained in the first elastomer composition exemplified above.

Storage modulus G2 of the second resin composition (making up insulation layer 41 of anisotropic conductive sheet 40) is preferably lower than storage modulus G1 of the first resin composition (making up insulation layer 11 of sheet connector 10). A reason for this is that when it is brought into pressure contact with the inspection object placed on it, anisotropic conductive sheet 40 can sufficiently deform and as a result electrical connection can be sufficiently performed. More specifically, G2/G1 may be $1\times10^{-5}$ to $1\times10^{-3}$.

It is preferable that thickness T2 of insulation layer 41 (making up anisotropic conductive sheet 40) be greater than thickness T1 of insulation layer 11 (making up sheet connector 10) (see FIG. 4). More specifically, it is preferable that T1/T2=0.01 to 0.4. A reason for this is that anisotropic conductive sheet 40 is normally has higher conductivity than that of sheet connector 10. The thicknesses of insulation layers 11 and 41 can be measured in compliance with ASTM D6988.

3-1-2. Conductive Path 42

Conductive path 42 extends through the thickness direction of insulation layer 41, and includes third end portion 42a exposed to third surface 41a side and fourth end portion 42b exposed to fourth surface 41b side (see FIG. 5B).

From the viewpoint of easily ensuring conductivity in the thickness direction, center-to-center distance p2 (pitch) of the plurality of conductive paths 42 on third surface 41a side is preferably greater than the center-to-center distance p1 (pitch) of the openings of the plurality of through holes 12 of sheet connector 10 on first surface 11a side (see FIG. 5B). More specifically, center-to-center distance p2 of third end portions 42a of the plurality of conductive paths 42 of anisotropic conductive sheet 40 may be 55 to 650 μm, for example.

Note that center-to-center distance p2 of third end portions 42a of the plurality of conductive paths 42 and the center-to-center distance of fourth end portions 42b may be identical to or different from each other. In the present embodiment, center-to-center distance p2 of third end portions 42a of the plurality of conductive paths 42 and the center-to-center distance of fourth end portions 42b are identical to each other, and they are referred to as the center-to-center distance of the plurality of conductive paths 42.

The material of conductive path 42 may be the same as the above-described material (metal materials and carbon materials) of conductive layer 13, and metal materials may be preferably used. Conductive path 42 may be a metal wire, for example.

The circle equivalent diameter of third end portion 42a of conductive path 42 on third surface 41a side is not limited as long as it allows for conduction, and may be about 20 to 200 μm, for example.

4. Electrical Testing Apparatus and Electrical Testing Method

Electrical Testing Apparatus

Figure 6:
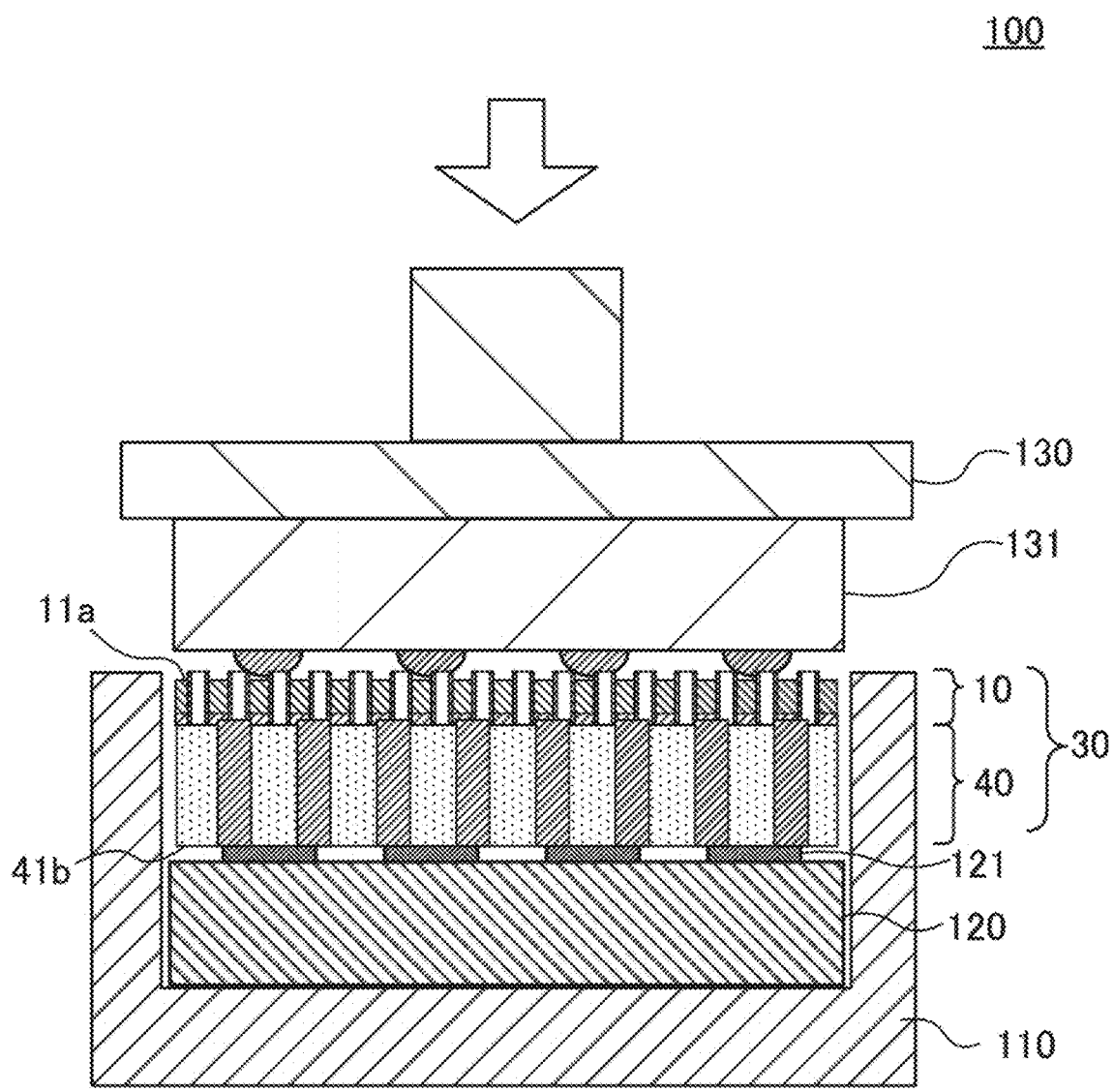
FIG. 6 is a sectional view illustrating an electrical testing apparatus according to Embodiment 1.

FIG. 6 is a sectional view illustrating an example of electrical testing apparatus 100 according to the present embodiment.

Electrical testing apparatus 100 is an apparatus that uses sheet set 30 of FIG. 4 and inspects the electrical characteristics (such as conduction) between terminals 131 (measurement points) of inspection object 130, for example. Note that in this drawing, inspection object 130 is also illustrated from the viewpoint of describing the electrical testing method.

As illustrated in FIG. 6, electrical testing apparatus 100 includes holding container (socket) 110, inspection substrate 120, and a laminate of sheet set 30 (i.e., anisotropic conductive sheet 40 and sheet connector 10).

Holding container (socket) 110 is a container for holding inspection substrate 120, anisotropic conductive sheet 10 and the like.

Inspection substrate 120 is disposed in holding container 110, and includes a plurality of electrodes 121 that faces measurement points of inspection object 130 at the surface facing inspection object 130.

In the laminate of sheet set 30, anisotropic conductive sheet 40, sheet connector 10, and inspection object 130 are disposed in this order on the surface of inspection substrate 120 where electrode 121 is disposed. Specifically, inspection object 130 is disposed on first surface 11a of sheet connector 10. Further, the electrode of inspection substrate 120 and the terminal of inspection object 130 are electrically connected to each other through conductive path 42 of anisotropic conductive sheet 40 and conductive layer 13 of sheet connector 10.

Inspection object 130 is not limited, but examples of inspection object 130 include various semiconductor devices (semiconductor packages) such as such as HBM and PoP, electronic components, and printed boards. In the case where inspection object 130 is a semiconductor package, the measurement point may be a bump (terminal). In addition, in comparison with inspection object 130 is a printed board, the measurement point may be a component mounting land and a measuring land provided at the conductive pattern.

Electrical Testing Method

An electrical testing method using electrical testing apparatus 100 of FIG. 6 is described below.

As illustrated in FIG. 6, the electrical testing method according to the present embodiment includes a step of stacking inspection substrate 120 including electrode 121 and inspection object 130 through anisotropic conductive sheet 40 and sheet connector 10, and electrically connecting electrode 121 of inspection substrate 120 and terminal 131 of inspection object 130 through the sheets.

When the above-mentioned step is performed, electrode 121 of inspection substrate 120 and terminal 131 of inspection object 130 may be pressurized by pressing inspection object 130, or brought into contact with each other under heating atmosphere as necessary, from the viewpoint of facilitating sufficient conductivity through anisotropic conductive sheet 40 and sheet connector 10.

As described above, sheet connector 10 includes the plurality of hollows 12' composed of through hole 12 and conductive layer 13. In this manner, when pressed with inspection object 130 disposed thereto, sheet connector 10 easily favorably deforms in the thickness direction. In addition, first end portion 13a of conductive layer 13 on first surface 11a side is protruded than first surface 11a. In this manner, it is also easy to make contact with inspection object 130, and the contact resistance with inspection object 130 can be reduced. In this manner, terminal 131 of inspection object 130 and electrode 121 of inspection substrate 120 of electrical testing apparatus 100 can be favorably electrically connected with each other with the laminate of anisotropic conductive sheet 40 and sheet connector 10.

Further, since the electrode surface (third surface 41a) of anisotropic conductive sheet 40 can be protected with sheet connector 10, variation of the resistance value of anisotropic conductive sheet 40 between conductive paths 42 can be suppressed.

Embodiment 2

1. Sheet Connector

Figure 7A:
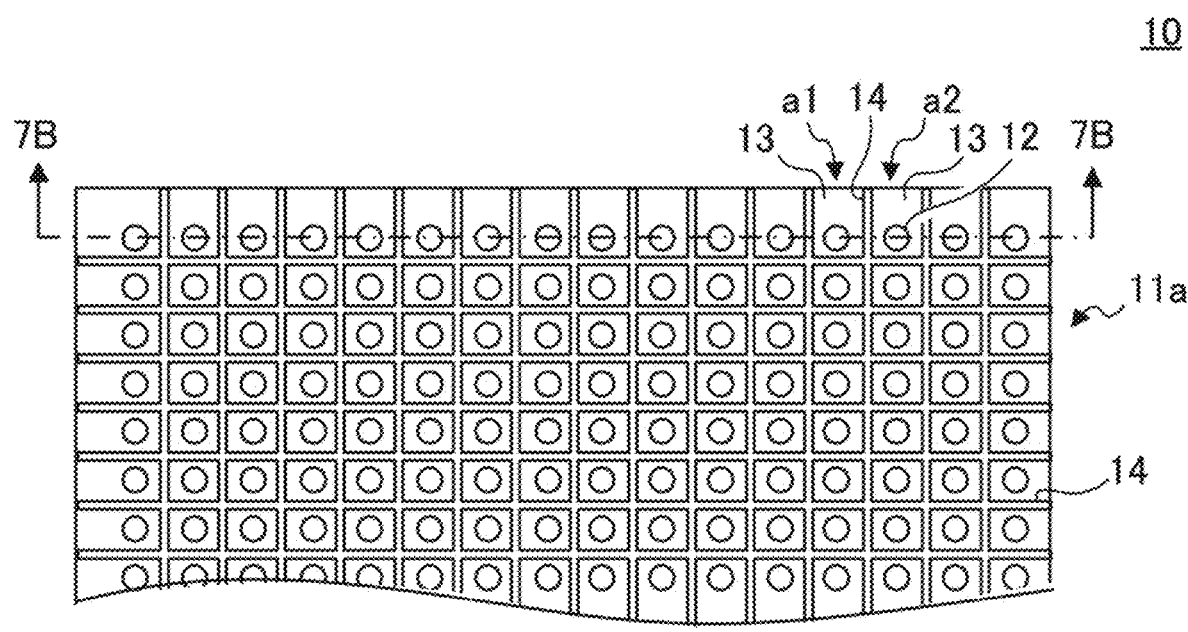
FIG. 7A is a plan view illustrating a sheet connector according to Embodiment 2.
Figure 7B:
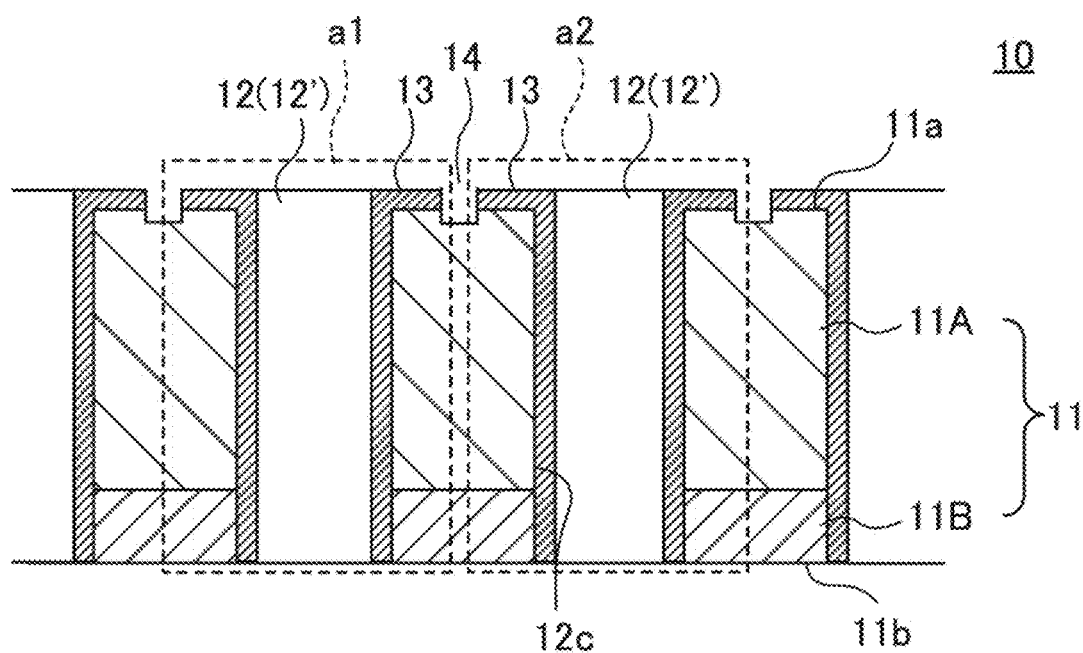
FIG. 7B is a partially enlarged sectional view taken along line 7B-7B of FIG. 7A.
Figure 8:
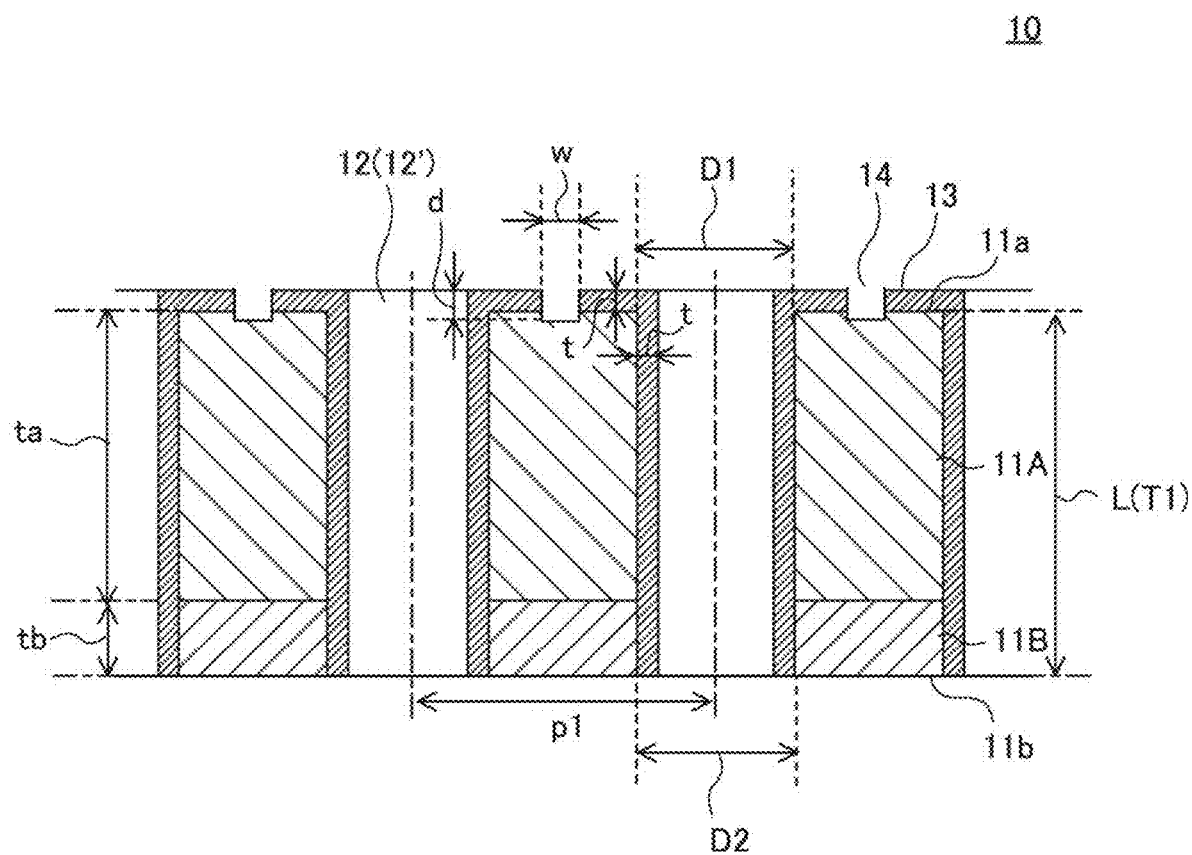
FIG. 8 is an enlarged view of FIG. 7B.

FIG. 7A is a plan view of sheet connector 10 according to Embodiment 2 (a side plan view of first surface 11a), and FIG. 7B is a partially enlarged sectional view of sheet connector 10 of FIG. 1A taken along line 7B-7B. FIG. 8 is an enlarged view of FIG. 7B.

As illustrated in FIGS. 7A and 7B, sheet connector 10 according to the present embodiment has the same configuration as that of the above-mentioned sheet connector 10 according to Embodiment 1 except that conductive layer 13 (first conductive layer) is continuously disposed not only at inner wall surface 12c of through hole 12, but also on first surface 11a, and that a plurality of valley lines 14 for insulating other conductive layer 13 is further provided.

Specifically, sheet connector 10 according to the present embodiment includes insulation layer 11 (first insulation layer) including the plurality of through holes 12 (first through holes), the plurality of conductive layers 13 (first conductive layers) disposed corresponding to the plurality of through holes 12 (for example, two conductive layers 13 surrounded by the broken line in FIG. 7B), and the plurality of valley lines 14 disposed between the plurality of conductive layers 13. This sheet connector 10 includes the plurality of hollows 12' surrounded by conductive layer 13. In addition, it is preferable that the inspection object be disposed at first surface 11a of insulation layer 11 as in the above-described Embodiment 1.

1-1. Insulation Layer 11 (First Insulation Layer)

Insulation layer 11 includes first surface 11a located on one side in the thickness direction, second surface 11b located on the other side in the thickness direction, and the plurality of through holes 12 extending between first surface 11a and second surface 11b (see FIG. 7B).

The layer configuration, thickness, material and the like of insulation layer 11 are the same as those of the above-described Embodiment 1. The shape, the circle equivalent diameters D1 and D2 of the openings, axial length L, center-to-center distance p1 (pitch) and the like of through hole 12 are also the same as those of the above-described Embodiment 1.

1-2. Conductive Layer 13 (First Conductive Layer)

Conductive layer 13 is disposed corresponding to through hole 12 (or hollow 12') (see FIG. 1B). More specifically, conductive layer 13 is disposed continuously to inner wall surface 12c of through hole 12 and the periphery of the opening of through hole 12 on first surface 11a. Then, the unit surrounded by the broken line conductive layer 13 functions as one conductive path (see FIG. 1B). Then, conductive layers 13 adjacent to each other (for example, in FIG. 7B, conductive layer 13 surrounded by broken line a1 and conductive layer 13 surrounded by broken line a2) are insulated by valley line 14 (see FIG. 1B).

The material and the volume resistivity of conductive layer 13 are the same as the material and the volume resistivity of conductive layer 13 of sheet connector 10 according to Embodiment 1.

It suffices that the thickness of conductive layer 13 is a thickness with which sufficient conduction can be achieved, and the plurality of conductive layers 13 do not make contact with each other with valley line 14 therebetween when pressed in the thickness direction of insulation layer 11. More specifically, the thickness of conductive layer 13 is preferably smaller than the width and depth of valley line 14.

More specifically, the thickness of conductive layer 13 may be 0.1 to 5 μm. When the thickness of conductive layer 13 has a certain value or greater, sufficient conduction is easily achieved, whereas when the thickness has a value smaller than a certain value, through hole 12 is unlikely to be closed or the terminal of the inspection object is less likely to be damaged due to contact with conductive layer 13. Note that thickness t of conductive layer 13 is the thickness in the direction parallel to the thickness direction of insulation layer 11 on first surface 11a, and is the thickness in the direction orthogonal to the thickness direction of insulation layer 11 on inner wall surface 12c of through hole 12 (see FIG. 8).

The circle equivalent diameter of hollow 12' surrounded by conductive layer 13 on first surface 11a side is also the same as the above-mentioned sheet connector 10 according to Embodiment 1.

1-3. Valley Line 14 (First Valley Line)

Valley line 14 is a groove formed in first surface 11a of insulation layer 11 of sheet connector 10. More specifically, valley line 14 is disposed between adjacent two conductive layers 13 on first surface 11a to insulate therebetween.

The cross-sectional shape of valley line 14 in the direction orthogonal to the extending direction is not limited, and may be a rectangular shape, a semicircular shape, a U-shape, or a V shape. In the present embodiment, the cross-sectional shape of valley line 14 is a rectangular shape.

Width w and depth d of valley line 14 are set to ranges with which conductive layer 13 on one side and conductive layer 13 on the other side do not make contact with each other with valley line 14 therebetween when sheet connector 10 is pressed in the thickness direction.

More specifically, when sheet connector 10 is pressed in the thickness direction, conductive layer 13 on one side and conductive layer 13 on the other side tend to approach and make contact with each other with valley line 14 therebetween. In view of this, preferably, width w of valley line 14 is greater than the thickness of conductive layer 13, and is 2 to 20 times the thickness of conductive layer 13.

Width w of valley line 14 is the maximum width in the direction orthogonal to the extending direction of valley line 14 in first surface 11a (see FIG. 8). Width w of valley line 14 may be constant or vary in the extending direction of valley line 14, but it is preferable to be constant.

Depth d of valley line 14 may be identical to or different from the thickness of conductive layer 13. Specifically, the deepest part of valley line 14 may be located at first surface 11a of insulation layer 11, or inside insulation layer 11. In particular, from the viewpoint of easily setting the value within a range in which one conductive layer 13 and the other conductive layer 13 do not make contact with each other with valley line 14 therebetween, depth d of valley line 14 is preferably greater than the thickness of conductive layer 13, more preferably 1.5 to 20 times the thickness of conductive layer 13 (see FIG. 7B).

Depth d of valley line 14 is the depth from the surface of conductive layer 13 to the deepest part in the direction parallel to the thickness direction of insulation layer 11 (see FIG. 8). Depth d of valley line 14 may be constant or vary with respect to the extending direction of valley line 14, but it is preferable to be constant.

Width w and depth d of valley line 14 may be identical to or different from each other.

2. Manufacturing Method for Sheet Connector

FIGS. 9A to 9G are sectional views illustrating a manufacturing method for sheet connector 10 according to the present embodiment.

Sheet connector 10 according to the present embodiment can be manufactured by any method. For example, sheet connector 10 is manufactured through a step 1) of preparing lamination sheet 21 including base material layer 21A and adhesive layer 21B (see FIG. 9A), a step 2) of disposing mask 22 on base material layer 11A of lamination sheet 21 and forming the plurality of through holes 12 at the portion not covered with mask 22 (see FIGS. 9B and 9C), a step 3) of removing the mask and covering the surface where adhesive layer 21B is exposed with protective sheet 24 (see FIG. 9D) to form conductive layer 23 at the surface of lamination sheet 21 where the plurality of through holes 12 is formed (see FIG. 9E), a step 4) of removing protective sheet 24 and forming valley line 14 with a depth from the surface of conductive layer 23 of lamination sheet 21 to the surface layer of base material layer 21A (see FIG. 9F) to form the plurality of conductive layers 13 (see FIG. 9G).

Figure 9A:
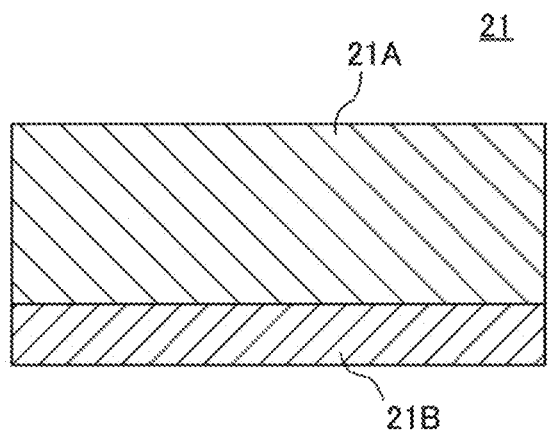
FIGS. 9A to 9D are partial sectional views illustrating a manufacturing method for the sheet connector according to Embodiment 2.
Figure 9B:
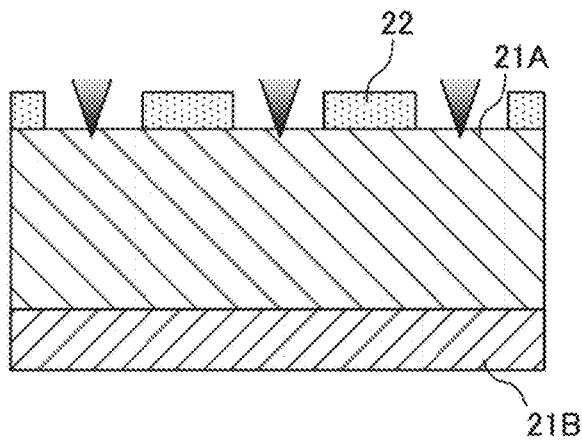
Figure 9C:
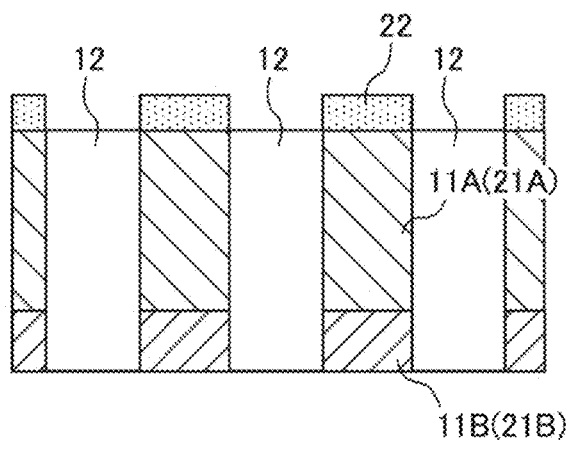
Figure 9D:
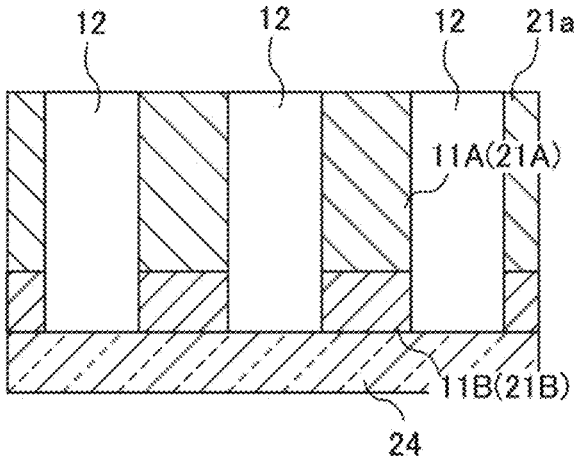

The step 1) to the step 3) are the same as the step 1) to the step 3) of the above-described Embodiment 1 (see FIGS. 9A to 9C).

Step 4

The plurality of valley lines 14 is formed in first surface 21a of lamination sheet 21 (see FIG. 9G). In this manner, the plurality of conductive layers 13 provided for each through hole 12 is provided by dividing conductive layer 23 by valley lines 14 (see FIG. 9G).

Valley line 14 may be formed by any method. For example, valley line 14 is preferably formed by a laser processing method. In the present embodiment, the plurality of valley lines 14 are formed in a cross shape in first surface 21a.

Note that the manufacturing method for sheet connector 10 may further include other steps (such as the step 6) of the above-mentioned in Embodiment 1) as necessary as in the above-described Embodiment 1.

As described above, the obtained sheet connector 10 may be used together with an anisotropic conductive sheet used as a probe of an electrical testing, or its alternative.

The sheet connector according to the present embodiment may be used as sheet set 30 together with anisotropic conductive sheet 40 (see FIGS. 4 to 6 described above) in an electrical testing apparatus and an electrical testing method as in the above-described Embodiment 1.

3. Effects

Sheet connector 10 according to the present embodiment achieves the following effects in addition to the above-described effects. Specifically, in sheet connector 10 according to the present embodiment, conductive layer 13 is disposed not only at inner wall surface 12c of through hole 12 but also on first surface 11a, and thus the contact resistance with inspection object 130 can be reduced. In this manner, the electrode 121 of inspection substrate 120 of electrical testing apparatus 100 and terminal 131 of inspection object 130 can be favorably electrically connected by the laminate of anisotropic conductive sheet 40 and sheet connector 10.

Modification

Figure 10A:
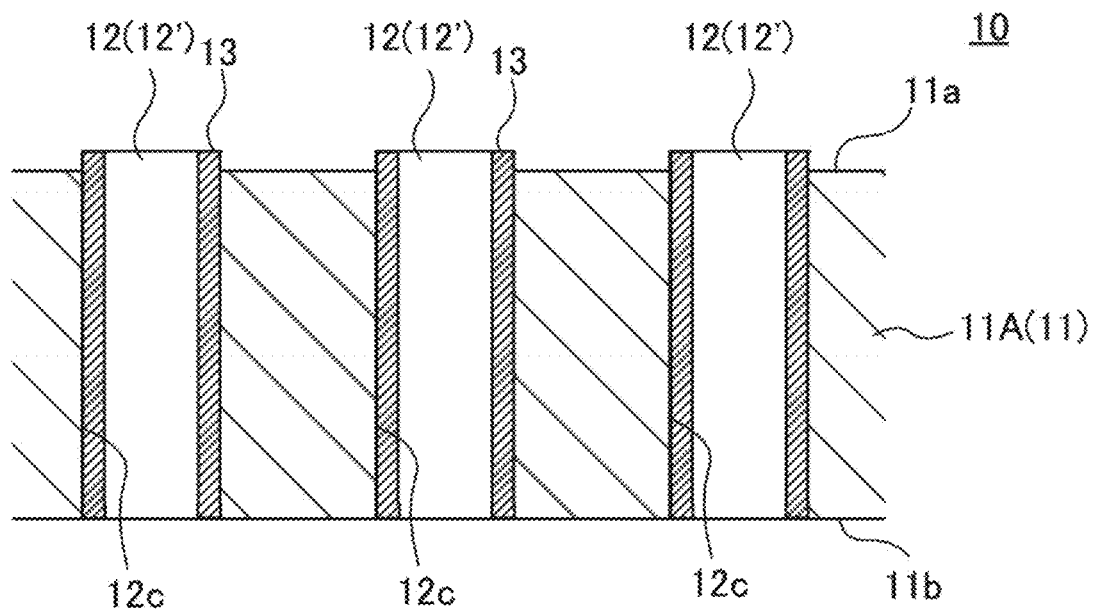
FIGS. 10A and 10B are partial sectional views illustrating a sheet connector according to a modification.
Figure 11A:
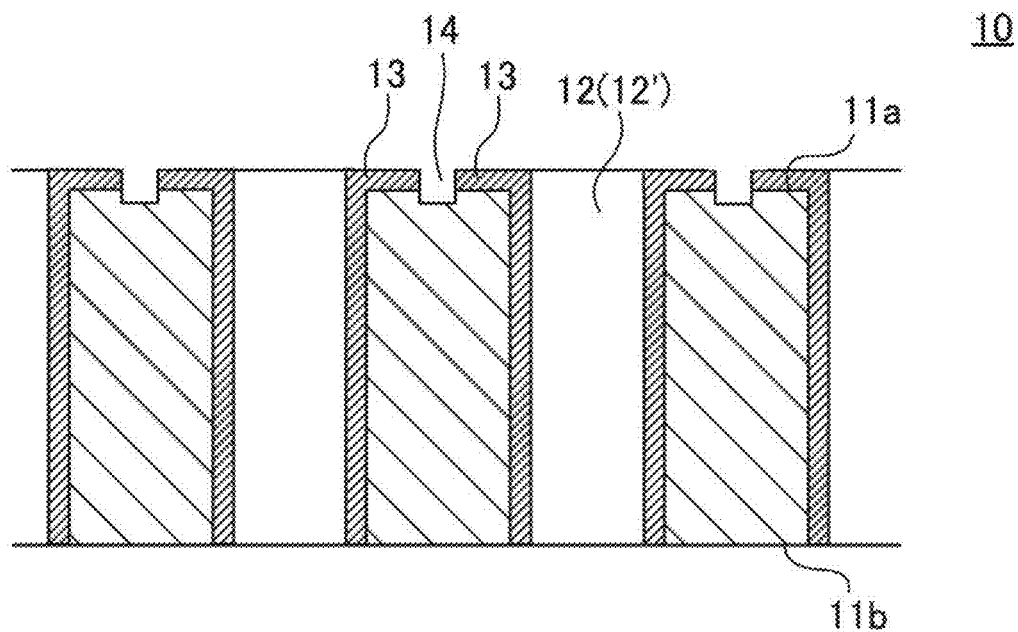
FIGS. 11A and 11B are partial sectional views illustrating a sheet connector according to a modification.

Note that while insulation layer 11 of sheet connector 10 includes adhesive layer 11B in the present embodiment, this is not limitative, and adhesive layer 11B may not be provided (see FIGS. 10A and 11A).

Figure 10B:
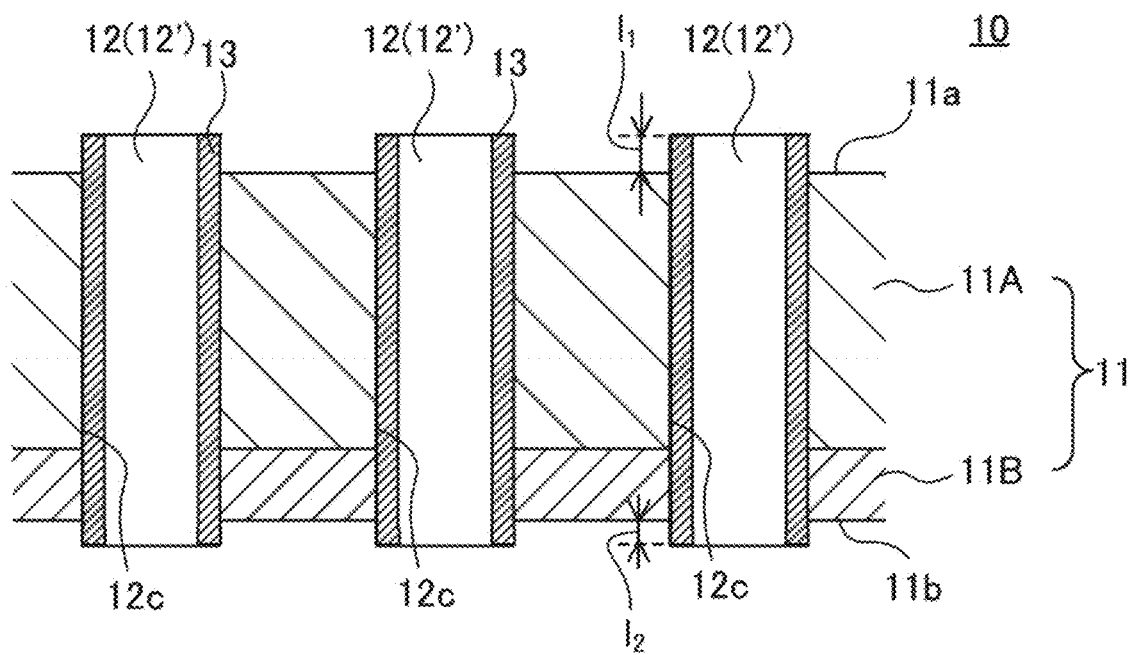

In addition, while only first end portion 13a of first conductive layer 13 protrudes from first surface 11a and second end portion 13b does not protrude from second surface 11b in the above-described Embodiment 1 (see FIG. 1B), this is not limitative, and both first end portion 13a and second end portion 13b of first conductive layer 13 may protrude from first surface 11a and second surface 11b (see FIG. 10B).

Preferably, protruding length $l_1$ of first end portion 13a of first conductive layer 13 is greater than protruding length $l_2$ of second end portion 13b (see FIG. 10B). Protruding length $l_1$ of first end portion 13a and protruding length $l_2$ of second end portion 13b may be the same as the range of the above-described Embodiment 1.

Figure 11B:
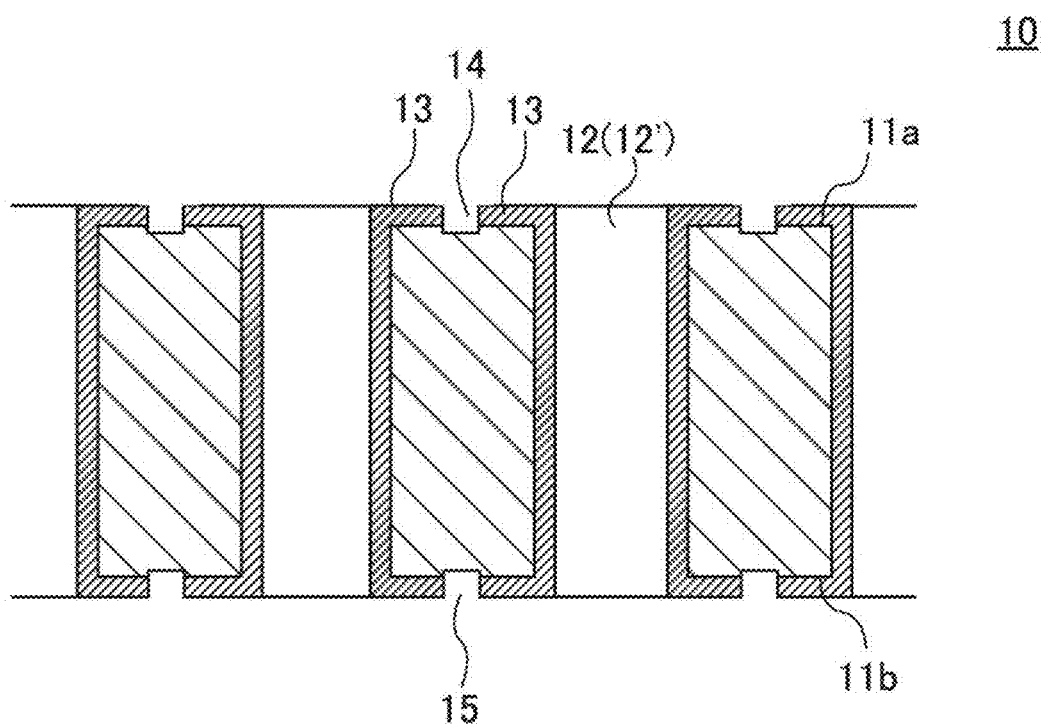

In addition, while conductive layer 13 is continuous to inner wall surface 12c of through hole 12 and the periphery of the opening of through hole 12 on first surface 11a, and is not disposed at the periphery of the opening of through hole 12 on second surface 11b in the above-described Embodiment 2, this is not limitative. For example, conductive layer 13 may be continuous to the periphery of the opening of through hole 12 on second surface 11b in addition to inner wall surface 12c of through hole 12 and the periphery of the opening of through hole 12 on first surface 11a (see FIG. 11B). In this case, valley line 15 (second valley line) is further disposed between the plurality of conductive layers 13 on second surface 11b (see FIG. 11B).

Sheet connector 10 having the above-mentioned configuration can achieve not only the electrical connection with the terminal of the inspection object, but also the electrical connection with the electrode of the inspection substrate, in an advanced manner. Thus, not only it can be used as a sheet connector used together with an anisotropic conductive sheet, but also it can be used alone as an alternative of an anisotropic conductive sheet.

In addition, while anisotropic conductive sheet 40 does not include a hollow in the present embodiment, this is not limitative, and anisotropic conductive sheet 40 may include a hollow as with sheet connector 10.

Figure 12:
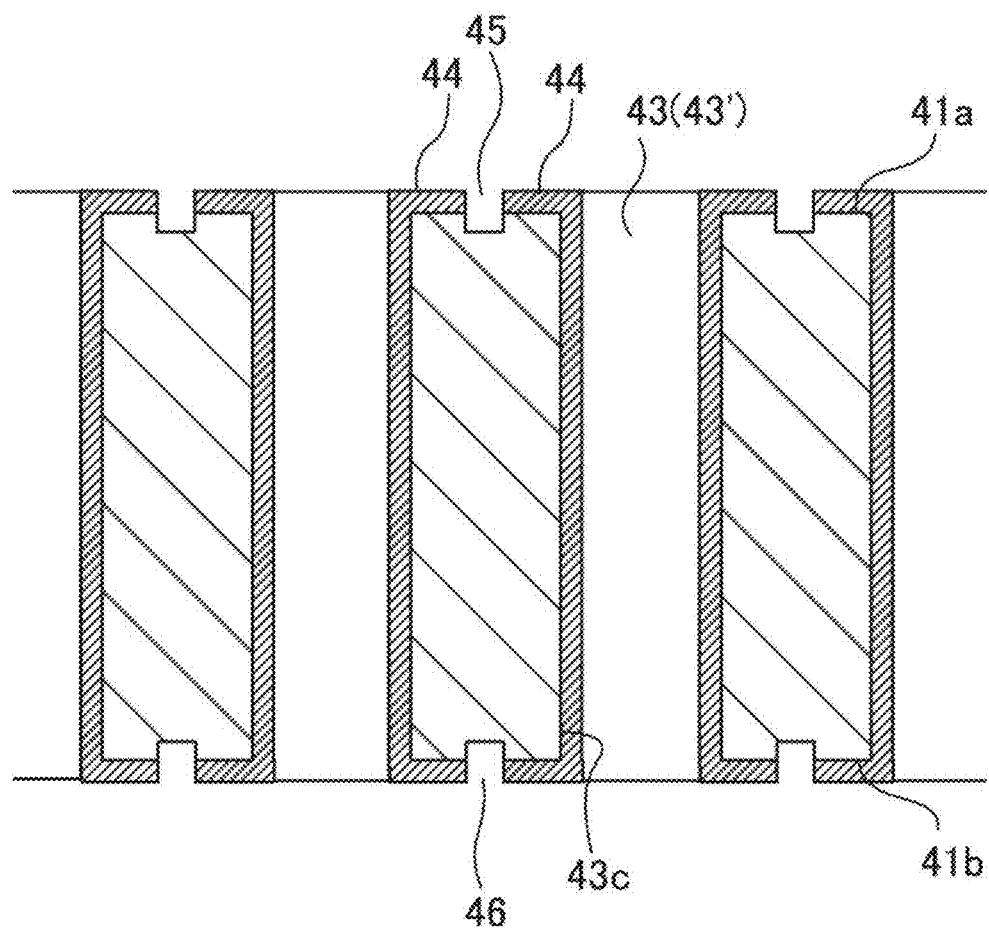
FIG. 12 is a partial sectional view illustrating an anisotropic conductive sheet according to a modification.

FIG. 12 is a partial sectional view illustrating anisotropic conductive sheet 40 according to a modification.

As illustrated in FIG. 12, insulation layer 41 (second insulation layer) making up anisotropic conductive sheet 40 may further include a plurality of through holes 43 (second through holes) extending between third surface 41a and fourth surface 41b. Further, each of the plurality of conductive paths 42 may be a plurality of conductive layers 44 (second conductive layer) disposed continuously to inner wall surface 43c of through hole 43 and the periphery of the opening of through hole 43 on third surface 41a in each of the plurality of through holes 43. In addition, anisotropic conductive sheet 40 includes valley line 45 disposed at third surface 41a and valley line 46 (second valley line) disposed at fourth surface 41b. The plurality of conductive paths 42 are insulated from each other by valley line 45 at third surface 41a and valley line 46 (second valley line) at fourth surface 41b.

In addition, while the anisotropic conductive sheet is used for electrical testing in the above-described embodiment, this is not limitative, and the anisotropic conductive sheet may be used for electrical connection between two electronic members, such as electrical connection between a glass substrate and a flexible printed board, and electrical connection between a substrate and an electronic component mounted to it.

This application is entitled to and claims the benefit of Japanese Patent Application No. 2019-211817 filed on Nov. 22, 2019, the disclosure each of which including the specification, drawings and abstract is incorporated herein by reference in its entirety.

INDUSTRIAL APPLICABILITY

According to the present invention, it is possible to provide a sheet connector, a sheet set, an electrical testing apparatus and an electrical testing method that can reliably perform electrical contact with an object while protecting the conductive path in the surface of the anisotropic conductive sheet.

REFERENCE SIGNS LIST

10 Sheet connector
11 Insulation layer
11a, 21a First surface
11b, 21b Second surface
11A, 21A Base material layer
11B, 21B Adhesive layer
12, 43 Through hole
12c, 43c Inner wall surface
13, 44 Conductive layer
13a First end portion
13b Second end portion
14, 45 Valley line (First valley line)
15, 46 Valley line (Second valley line)
21 Lamination sheet
22 Mask
23 Conductive layer
24 Protective sheet
30 Sheet set
40 Anisotropic conductive sheet
41 Insulation layer (Second insulation layer)
41a Third surface
41b Fourth surface
42 Conductive path
42a Third end portion
42b Fourth end portion
100 Electrical testing apparatus
110 Holding container
120 Inspection substrate
121 Electrode
130 Inspection object
131 Terminal (of inspection object)

What is claimed is:
1. A sheet connector, comprising:
a first insulation layer including a first surface located on one side in a thickness direction, a second surface located on another side in the thickness direction, and a plurality of first through holes extending between the first surface and the second surface; and a plurality of first conductive layers disposed at an inner wall surface of each of the plurality of first through holes, wherein a first end portion of each of the plurality of first conductive layers on a first surface side is protruded than the first surface, and wherein the first insulation layer further includes a first base material layer including the first surface and comprising a first resin composition, the first resin composition having a glass transition temperature of 120° C. or higher.

2. The sheet connector according to claim 1, wherein a second end portion of each of the plurality of first conductive layers on a second surface side is protruded than the second surface.

3. The sheet connector according to claim 1, wherein the first insulation layer further includes an adhesive layer including the second surface.

4. The sheet connector according to claim 1, wherein a glass transition temperature of the first resin composition is 150° C. or higher.

5. The sheet connector according to claim 1, wherein a coefficient of thermal expansion of the first resin composition is 60 ppm/K or smaller.

6. The sheet connector according to claim 1, wherein a protruding length of the first end portion of each of the plurality of first conductive layers on the first surface side is greater than a protruding length of the second end portion of each of the plurality of first conductive layers on a second surface side.

7. The sheet connector according to claim 6, wherein each of the protruding length of the first end portion and the protruding length of the second end portion is 1 to 7 μm.

8. A sheet connector, comprising:
a first insulation layer including a first surface located on one side in a thickness direction, a second surface located on another side in the thickness direction, and a plurality of first through holes extending between the first surface and the second surface;
a plurality of first conductive layers disposed continuously to an inner wall surface of each of the plurality of first through holes and a periphery of an opening of each of the plurality of first through holes on the first surface in each of the plurality of first through holes; and
a plurality of valley lines disposed between the plurality of first conductive layers on the first surface, and configured to insulate the plurality of first conductive layers; and
wherein the first insulation layer further includes a first base material layer including the first surface and comprising a first resin composition, the first resin composition having a glass transition temperature of 120° C. or higher.

9. The sheet connector according to claim 8, wherein a width of each of the plurality of valley lines is greater than a thickness of each of the plurality of first conductive layers.

10. The sheet connector according to claim 8, wherein a depth of each of the plurality of valley lines is greater than a thickness of each of the plurality of first conductive layers.

11. The sheet connector according to claim 8, wherein the first insulation layer further includes an adhesive layer including the second surface.

12. The sheet connector according to claim 11, wherein a probe tack value measured at 25° C. in compliance with American Society for Testing and Materials D2979:2016 of the second surface of the adhesive layer is higher than the probe tack value of the first surface of the first base material layer; and wherein the probe tack value of the adhesive layer is 3N/5 mmφ or greater.

13. The sheet connector according to claim 8, wherein a center-to-center distance p1 of openings of the plurality of first through holes on the first surface side is 5 to 55 μm.

14. The sheet connector according to claim 8,
wherein the sheet connector is used for electrical testing of an inspection object; and
wherein the inspection object is disposed on the first surface of the sheet connector.

15. A sheet set, comprising:
the sheet connector according to claim 8; and
an anisotropic conductive sheet configured to be disposed on the second surface of the sheet connector,
wherein the anisotropic conductive sheet includes:
a second insulation layer including a third surface located on one side in a thickness direction and a fourth surface located on another side in the thickness direction; and
a plurality of conductive paths disposed to extend in the thickness direction in the second insulation layer and exposed to outside of the third surface and the fourth surface,
wherein the third surface of the second insulation layer of the anisotropic conductive sheet is in contact with the second surface of the first insulation layer of the sheet connector,
wherein at least a part of the plurality of conductive paths of the anisotropic conductive sheet are electrically connected with at least a part of the plurality of first conductive layers of the sheet connector, and
wherein a center-to-center distance p1 of openings of the plurality of first through holes of the sheet connector on a first surface side is smaller than a center-to-center distance p2 of the plurality of conductive paths of the anisotropic conductive sheet on a third surface side.

16. The sheet set according to claim 15,
wherein the second insulation layer further includes a plurality of second through holes extending between the third surface and the fourth surface; and
wherein the plurality of conductive paths is a plurality of second conductive layers, each of the plurality of second conductive layers being disposed continuously to an inner wall surface of each of the plurality of second through holes and a periphery of an opening of each of the plurality of second through holes on the third surface in each of the plurality of second through holes.

17. The sheet set according to claim 15, wherein a thickness of the first insulation layer is smaller than a thickness of the second insulation layer.

18. The sheet set according to claim 15,
wherein the second insulation layer includes a second base material layer comprising a second resin composition; and
wherein a storage modulus of the second resin composition is lower than a storage modulus of the first resin composition.

19. An electrical testing apparatus, comprising:
an inspection substrate including a plurality of electrodes; and
a laminate of the sheet set according to claim 15 disposed on a surface of the inspection substrate where the plurality of electrodes is disposed, wherein the anisotropic conductive sheet is disposed on the surface of the inspection substrate where the plurality of electrodes is disposed, wherein at least a part of the plurality of the electrode of an inspection substrate are electrically connected with at least a part of the plurality of conductive paths of the anisotropic conductive sheet, wherein the sheet connector is disposed on the third surface of the second insulation layer of the anisotropic conductive sheet, and wherein the inspection object is disposed on the first surface of the first insulation layer of the sheet connector.

20. An electrical testing method, comprising:

stacking an inspection substrate including a plurality of electrodes and an inspection object including a terminal through a laminate of the sheet set according to claim 15 to electrically connect each of the plurality of electrodes of the inspection substrate and the terminal of the inspection object through the sheet connector, wherein the anisotropic conductive sheet is disposed on the surface of the inspection substrate where the plurality of electrodes is disposed, wherein at least a part of the plurality of the electrode of an inspection substrate are electrically connected with at least a part of the plurality of conductive paths, wherein the sheet connector is disposed on the third surface of the second insulation layer of the anisotropic conductive sheet, and wherein the inspection object is disposed on the first surface of the first insulation layer of the sheet connector.

* * * * *